(12) United States Patent
Spencer et al.

(10) Patent No.: US 7,569,206 B2
(45) Date of Patent: *Aug. 4, 2009

(54) GROUP III NITRIDE COMPOSITIONS

(75) Inventors: Michael G. Spencer, Ithaca, NY (US);
Francis J. DiSalvo, Ithaca, NY (US);
Huaqiang Wu, Mountain View, CA (US)

(73) Assignee: Cornell Research Foundation, Inc., Ithaca, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/060,749

(22) Filed: Apr. 1, 2008

(65) Prior Publication Data

US 2008/0274030 A1    Nov. 6, 2008

Related U.S. Application Data

(63) Continuation of application No. 11/650,569, filed on Jan. 5, 2007, now Pat. No. 7,381,391, which is a continuation of application No. PCT/US2005/024427, filed on Jul. 11, 2005.

(60) Provisional application No. 60/586,545, filed on Jul. 9, 2004, provisional application No. 60/632,275, filed on Dec. 1, 2004.

(51) Int. Cl.
*C01B 21/06* (2006.01)

(52) U.S. Cl. .................................... 423/490
(58) Field of Classification Search ............ 423/409
See application file for complete search history.

(56) References Cited

U.S. PATENT DOCUMENTS

| 3,829,556 A | 8/1974 | Logan et al. |
| 4,144,116 A | 3/1979 | Jacob et al. |
| 6,096,282 A | 8/2000 | Kaner et al. |
| 6,120,748 A | 9/2000 | Kaner et al. |
| 6,139,629 A | 10/2000 | Kisielowski et al. |

(Continued)

FOREIGN PATENT DOCUMENTS

WO    WO-2006/010075 A1    1/2006

OTHER PUBLICATIONS

"U.S. Appl. No. 11/650,569, Notice of Allowance mailed Jan. 24, 2008", 7 pgs.

(Continued)

*Primary Examiner*—Wayne Langel
(74) *Attorney, Agent, or Firm*—Schwegman, Lundberg & Woessner, P.A.; Michael H. Haukaas

(57) ABSTRACT

The present invention provides compositions and a novel high-yielding process for preparing high purity Group III nitrides. The process involves heating a Group III metal and a catalytic amount of a metal wetting agent in the presence of a nitrogen source. Group III metals can be stoichiometrically converted into high purity Group III nitride powders in a short period of time. The process can provide multi-gram quantities of high purity Group III nitrides in relatively short reaction times. Detailed characterizations of GaN powder were performed and are reported herein, including morphology and structure by SEM and XRD, optical properties by cathodoluminescence (CL), and Raman spectra to determine the quality of the GaN particles. The purity of GaN powder was found to be greater than 99.9% pure, as analyzed by Glow Discharge Mass Spectrometry (GDMS). Green, yellow, and red light emission can be obtained from doped GaN powders.

20 Claims, 12 Drawing Sheets

U.S. PATENT DOCUMENTS

| | | | |
|---|---|---|---|
| 6,177,057 | B1 | 1/2001 | Purdy |
| 6,270,569 | B1 | 8/2001 | Shibata et al. |
| 6,379,472 | B1 | 4/2002 | Kisielowski et al. |
| 6,406,677 | B1 | 6/2002 | Carter et al. |
| 7,255,844 | B2 | 8/2007 | Ponce et al. |
| 7,381,391 | B2 * | 6/2008 | Spencer et al. ............. 423/290 |
| 2003/0086856 | A1 | 5/2003 | D'Evelyn et al. |
| 2003/0226497 | A1 | 12/2003 | Hara |
| 2007/0248526 | A1 | 10/2007 | Spencer et al. |

OTHER PUBLICATIONS

"International Application No. PCT/US05/24427, International Search Report mailed Dec. 7, 2005", 3 pgs.

"International Application No. PCT/US05/24427, Written Opinion mailed Dec. 7, 2005", 6 pgs.

Addamiano, A., "On the Preparation of the Nitrides of Aluminum and Gallium", *Journal of the Electrochemical Society*, 108(11), (1961),p. 1072.

Akasaki, I., et al., "The evolution of group III nitride semiconductors. Seeking blue light emission", *Materials Science & Engineering B (Solid-State Materials for Advanced Technology)*, B74(1-3), (May 1, 2000),101-6.

Baba, K., et al., "Synthesis and properties of ultrafine AlN powder by rf plasma", *Applied Physics Letters*, 54(23), (1989),2309-2311.

Balkas, C. M., et al., "Synthesis Routes and Characterization of High-Purity, Single-Phase Gallium Nitride Powders", *J. Am. Ceram. Soc.*, 79, (1996),2309-2312.

Birkhahn, R H., et al., "Optical and Structural Properties or $Er^{3+}$-Doped GaN Grown by MBE", *MRS Internet J. Nitride Semicond. Res. 4S1, G3.80*, (1999), 6 pages.

Cao, X. A., et al., "Advanced Processing of GaN for Electronic Devices", *Critical Reviews in Solid State and Materials Sciences*, 25(4), (2000),279-390.

Haffouz, S., et al., "Structural properties of maskless epitaxial lateral overgrown MOCVD GaN layers on Si (1 1 1) substrates", *Journal of Crystal Growth*, 248, (2003), 568-572.

Johnson, W. C., et al., "Nitrogen Compounds of Gallium. III. Gallie Nitride", *The Journal of Physical Chemistry*, 36(10), (1932), 2651-2654.

Kim, K.-H. , et al., "Ultrafine Aluminium Nitride Powder Produced by Plasma-Assisted Chemical Vapour Deposition of Trimethylalumium", *Journal of Materials Science*, 27, (1992), 2580-2588.

Lorenz, M. R., et al., "Preparation, Stability, and Luminescence of Gallium Nitride", *Journal of the Electrochemical Society*, 109(1), (1962), 24-26.

Lozykowski, H J., et al., "Visible cathodoluminescence of GaN doped with Dy, Er, and Tm", *Applied Physics Letters*, 74(8), (Feb. 22, 1999),1129-1131.

Nahm, K. S., et al., "The Catalytic Growth of GaN Powders", *Proceedings of International Workshop on Nitride Semiconductors*, (The Institute of Pure and Applied Physics (IPAP) Conference Series 1),(2000), 30-33.

Shibata, M. , et al., "Synthesis of Gallium Nitride by Ammonia Injection into Gallium Melt", *Journal of Crystal Growth*, 196, (1999), 47-52.

Steckl, A J., et al., "Visible emission from Er-doped GaN grown by solid source molecular beam epitaxy", *Applied Physics Letters*, 73(12), (Sep. 21, 1998), 1700-1702.

Vaidhyanathan, B., et al., "Novel Synthesis of Nitride Powders by Microwave-Assisted Combustion", *J. Mater. Res.*, 15(4), (2000), 974-981.

Balkas, C. M., et al., "Synthesis and Characterization of High Purity, Single Phase GaN Powder", *Powder Diffr.*, 10(4), (1995),266-268.

Cahn, J. W., "Critical Point Wetting", *The Journal of Chemical Physics*, 66(8), (1977),3667-3672.

Chatain, D. , et al., "Experimental Evidence for a Wetting Transition in Liquid Ga-Pb Alloys", *Surface Science*, 345, (1996),85-90.

Davydov, V. Y., et al., "Phonon Dispersion and Raman Scattering in Hexagonal GaN and AlN", *Physical Review B*, 58(19), (1998),12899-12907.

Di Lello, B. C., et al., "Synthesis and Characterization of GaN Using Gas-Solid Reactions", *Materials Science and Engineering*, B93, (2002),219-223.

Flom, E. B., et al., "In-Plane Structure of the Liquid-Vapor Interface of an Alloy: A Grazing Incidence X-ray Diffraction Study of Bismuth: Gallium", *Science*, 260, (1993),332-335.

Garcia, R., et al., "Synthesis, Structure and Luminescence of High Brightness Gallium Nitride Powder", *Materials Research Society Symposium Proceedings*, vol. 798, (2004), Y10.75.1-Y10.75-6.

Hara, K., et al., "High-Rate Particle Growth Using GaCl and $NH_3$ as Sources in Two-Stage Vapor-Phase Method for Synthesis of GaN Powders", *Japanese Journal of Applied Physics*, vol. 41, (2002), L1351-1353.

Konenkova, E. V., et al., "Raman Spectroscopy of GaN Nucleation and Free-Standing Layers Grown by Hydride Vapor Phase Epitaxy on Oxidized Silicon", *Applied Physics Letters*, 83(4), (2003), 629-631.

Kumar, M. S., et al., "Structural Studies on Synthesised Gallium Nitride", *Journal of Crystal Growth*, 211, (2000), 184-188.

Pichugin, I. G., et al., "Preparation of Gallium Nitride", *Inorganic Materials*, 6, (1972), 1732-1734.

Ponce, F. A., et al., "Direct Imaging of Impurity-Induced Raman Scattering in GaN", *Applied Physics Letters*, 69(18), (1996), 2650-2652.

Qui, Y. , et al., "Novel Synthesis of Nanocrystalline Gallium Nitride Powder from Gallium(III)-Urea Complex", *Chemistry Letters*, 32(8), (2003), 774-775.

Skromme, B. J., et al., "Optical Spectroscopy of Bulk GaN Crystals Grown from a Na—Ga Melt", *Applied Physics Letters*, 81(20), (2002), 3765-3767.

Tostmann, H., et al., "Microscopic Structure of the Wetting Film at the Surface of Liquid Ga—Bi Alloys", *Physical Review Letters*, 84(19), (2000), 4385-4388.

* cited by examiner

GROUP III NITRIDE COMPOSITIONS

RELATED APPLICATIONS

This application is a continuation of U.S. patent application Ser. No. 11/650,569, filed Jan. 5, 2007 now U.S. Pat. No. 7,381,391, which is a continuation under 35 U.S.C. 111(a) of PCT/US2005/024427, filed Jul. 11, 2005 and published as WO 2006/010075 A1 on Jan. 26, 2006, which application is a continuation-in-part based on Provisional Application Ser. No. 60/586,545 filed Jul. 9, 2004 and Provisional Application Ser. No. 60/632,275 filed Dec. 1, 2004, which applications and publication are incorporated herein by reference and made a part hereof.

FIELD OF THE INVENTION

The field of the invention relates to coatings and semiconductor materials, more specifically the preparation of Group III nitride compositions.

BACKGROUND OF THE INVENTION

Commercial gallium nitride (GaN) is typically synthesized through the reaction of gallium oxide ($Ga_2O_3$) with ammonia ($NH_3$), which results in GaN with a high concentration of residual oxygen. High impurity concentrations increases the density of dislocations in GaN single crystals and inhibits continuous growth. Commercial powders made from metal gallium (Ga) are extremely expensive and the quantity available is limited because the yield of current processes is low.

Gallium nitride in the wurtzite form has a large direct band gap of 3.45 eV at room temperature. GaN also forms a continuous range of solid solutions with aluminum nitride (AlN) (6.28 eV) and indium nitride (InN) (1.95 eV). Thus, Group III-nitrides, and gallium nitride in particular, are very attractive for use in opto-electronic devices because any band gap with energy in this range, from the visible to the deep UV, is theoretically achievable with these materials. Opto-electronic devices are currently fabricated by growing GaN on heterosubstrates such as sapphire, SiC, ZnO, $Al_2O_3$, $LiGaO_2$, and $LiAlO_2$. The mismatches in lattice parameters and thermal expansion coefficients result in high dislocation densities in these films.

Group III nitrides are widely known to emit light ranging from UV to the visible spectra. Many group III nitrides therefore show potential as opto-electronic light sources (S. Nakamura, et al., *Jpn. J. Appl. Phys.* 1996, 35, L217) and high frequency power devices (M. A. Kahn, et al. *Appl. Phys. Lett.* 1993, 63, 1214). For example, gallium nitride powder can be used to make optical displays by utilizing the fluorescent properties of GaN crystals (see K. Hara, U.S. Patent Application Publication No. 2003/0226497 A1). Group III nitrides can be valuable in combination with ceramics, particularly the aluminum nitrides (see "A study of the physical properties and electrochemical behavior of AlN films", F. Vacandio, Y. Massiani, P. Gravier, *Surf Coat. Tech.* 1997, 92, 221).

In order to continue and speed the development of this technology, bulk substrates are greatly desired. Bulk substrates will allow the realization of high device efficiencies, lower leakage currents, and longer device lifetimes. GaN bulk single crystals and wafers are thus greatly desired for homoepitaxial film growth. Crystal growth processes for GaN bulk growth, e.g., sublimation and high-pressure methods, demand the availability of a high purity, single-phase GaN powder.

Johnson et al. first presented the synthesis of GaN powder by flowing $NH_3$ over molten gallium at temperatures of 900-1000° C. (W. C. Johnson, J. B. Parsons, M. C. Crew, *J. Phys. Chem.* 1932, 36, 2651). Later, Lorenz developed a synthetic method of preparing GaN using $Ga_2O_3$ and $NH_3$ (M. R. Lorenz, B. B. Binkowski, *J. Electrochem. Soc.* 1962, 109, 24). In 1972, Pichugin and Yas'kov (I. G. Pichugin, D. A. Yaskov, *Inorg. Mat.* 1972, 6, 1732) showed that GaN powder could be synthesized via the reaction: $Ga(l)+NH_3(g)=GaN(s)+3/2H_2(g)$ where $\Delta G_r=-51$ kJ/mol at 800° C. Compared to the conversion from $Ga_2O_3$, the key advantage of this procedure is that GaN powder of higher purity can be obtained. GaN powder has also been synthesized by injecting $NH_3$ into molten Ga under atmospheric pressure in the temperature range of 900-980° C. (M. Shibata, T. Furuya, H. Sakaguchi, S. Kuma, *J. Crystal Growth* 1999, 196, 47). There is only one report of the efficient conversion of Ga to GaN with flowing $NH_3$ in a horizontal furnace (C. H. Balkas, R. F. Davis, *J. Am. Ceram. Soc.* 1996, 79, 2309).

Several research groups have demonstrated the growth of GaN powders through various other synthetic methods. $Ga_2O$ (C. M. Balkas, R. F. Davis, *J. Am. Ceramic Soc.* 1996, 79, 2309), and GaP or GaAs (A. Addamino, *J. Electrochem. Soc.* 1961, 108, 1072) have been used as precursors and reacted with $NH_3$ to make GaN powder. Other methods have also been explored recently, such as the decomposition of organometallic compounds containing Ga and N (K. H. Kim, C. H. Ho, H. Doerr, C. Deshpandey, R. F. Bunshah, *J Mater. Sci.* 1992, 27, 2580), plasma synthesis (K. Baba, N. Shokata, M. Yonezawa, *Appl. Phys. Lett.* 1989, 54, 2309), and microwave-assisted combustion methods (B. Vaidhyanathan, D. K. Agrawal, R. Roy, *J. Mater. Res.* 2000, 15, 974). Junko disclosed a method of obtaining GaN powders by dropping an ammonia solution into gallium nitric hydrate solution to form gallium hydroxide, followed by dehydration to form gallium oxide, which was then heated under an ammonia atmosphere (Junko et al., Japanese Patent Application No. 10-373540). These processes, however, do not disclose the advantages of using a wetting agent, and more efficient and suitable processes are required by industry. Additionally, most of these methods experience either very low yields or high impurity concentrations.

Cahn first introduced the idea of interfacial wetting in 1977 (J. W. Cahn, *J. Chem. Phys.* 1977, 66, 3677). Cahn suggested that one component in a binary liquid mixture might segregate to the liquid surface. Recently, interfacial wetting has been observed in fluid alkali metal-alkali halide and liquid gallium-based binary alloys, such as Ga—Bi (E. B. Flom, M. Li, A. Acero, N. Maskil, S. A. Rice, *Science* 1993, 260, 332; H. Tostmann, E. DiMasi, O. G. Shpyrko, P. S. Pershan, B. M. Ocko, M. Deutsch, *Phys. Rev. Lett.* 2000, 84, 4385) and Ga—Pb (D. Chatain, P. Wynblatt, *Surf. Sci.* 1996, 345, 85). Bismuth has been used as surfactant in growing GaN thin films by a Molecular Beam Epitaxy (MBE) technique disclosed by Kisielowski in U.S. Pat. No. 6,379,472. Nickel-mesh has been used as a catalyst to help decrease the kinetic barrier to forming GaN (K. S. Nahm, S. H. Ahn, S. H. Lee, *IPAP Conf. Series* 1, 2000, 30). None of these studies, however, disclose the use of bismuth, germanium, tin, or lead as a wetting agent for the preparation of Group III nitrides.

Currently, there is a need for bulk supplies of Group III nitrides, particularly high purity Group III nitrides. Few companies in the US manufacture commercial gallium nitride (GaN) powder, and the commercial powders typically contain relatively high levels of impurities. Because of the lack of highly efficient methods for the synthesis of Group III nitrides, novel preparations are highly desirable.

Additionally, recent demonstrations of visible (blue, green, red) and infrared (1.54 μm) electroluminescence from rare earth (RE) doped gallium nitride produced significant interest in Group III nitrides for potential applications in optical communications and full color displays (A. J. Steckl and J. M. Zavada, *Mater. Res. Bull.* 1999, 24, 33; A. J. Steckl, et al. *Compound Semicond.* 2000, 6, 48). The properties of erbium-doped GaN and other III-V semiconductors have been reviewed by Zavada and Steckl (J. M. Zavada and D. Zhang, *Solid-State Electron.* 1995, 38, 1285; A. J. Steck, et al. *IEEE J. Selected Topics in Quantum Electronics,* 2002, 8, 749) The GaN-based semiconductor structures are of great interest because they appear to be optically robust, and chemically and thermally stable. Favennec et al. reported a strong dependence of the emission intensity of the $Er^{3+}$ ions on the band gap of the host semiconductor and on the material temperature (P. N. Favennec, et al. *Electron. Lett.* 1989, 25, 718). The wide band-gap of GaN leads to a reduced RE emission quenching effect and the observation of strong RE emission at room temperature (ibid). Accordingly, novel preparations of rare earth metal-doped Group III nitride compositions are needed.

SUMMARY OF THE INVENTION

The present invention provides compositions and novel processes for preparing high purity, single phase Group III nitrides, and in particular, gallium nitride. The invention also provides novel compounds prepared by the methods described herein. The process involves heating a Group III metal and a catalytic amount of a metal wetting agent, e.g., bismuth, in the presence of a nitrogen source, e.g., ammonia. Group III metals can be stoichiometrically converted into high purity Group III nitride powders in less than 6 hours. The process can provide hundred-gram quantities of high purity Group III nitrides in relatively short reaction times. For example, 100 grams of gallium metal was converted into 120 grams of high-purity gallium nitride powder, corresponding to a greater than 99.9% yield, in five hours of reaction time.

Detailed characterizations of gallium nitride (GaN) powder prepared by these methods were performed and are reported herein. The purity of GaN powder prepared was greater than 99.9% pure, as analyzed by Glow Discharge Mass Spectrometry (GDMS). The morphology and structure of the resulting GaN powder were investigated by SEM and XRD. The optical properties of the product were characterized by cathodoluminescence (CL). Raman spectra were measured at room temperature to determine the quality of the GaN particles. The GaN produced was high purity, hexagonal polycrystalline material, composed of plate-like grains 1 to 20 μm in diameter.

BRIEF DESCRIPTION OF THE DRAWINGS

FIG. 6(*b*) illustrates a SEM image of a large GaN plate, showing a 2 μm resolution bar.

DETAILED DESCRIPTION OF THE INVENTION

Figure 1:
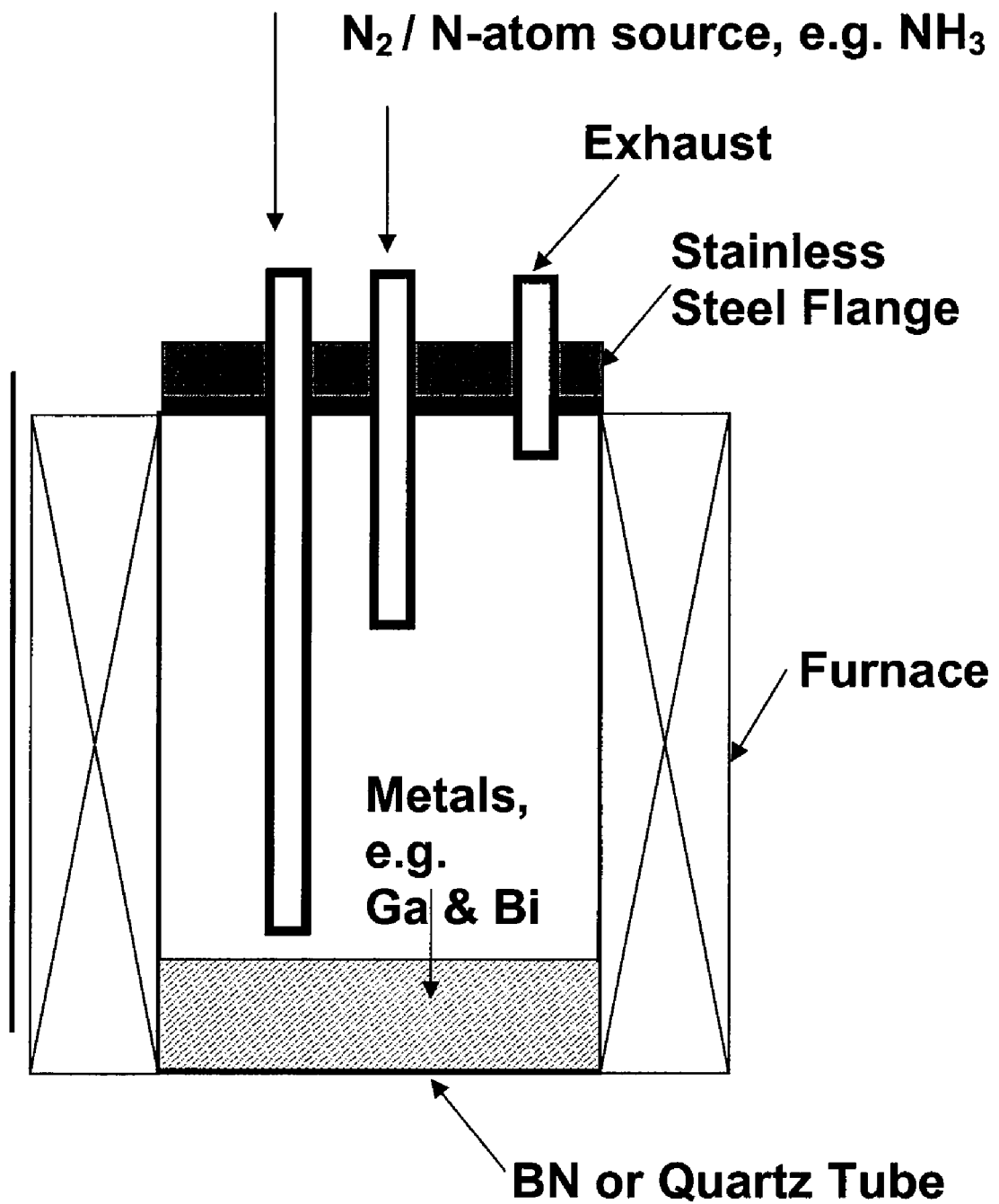
FIG. 1 illustrates a schematic view of a vertical furnace used for preparing Group III nitrides.

The present invention provides a novel synthetic process for preparing high purity, single phase Group III nitrides, and in particular, gallium nitride. The process involves heating a Group III metal and a catalytic amount of a metal wetting agent, e.g., bismuth, in the presence of a nitrogen source, e.g., ammonia. The Group III metals are stoichiometrically converted into high purity Group III nitride powders in less than 6 hours. The process can provide one hundred-gram quantities of high purity Group III nitrides in relatively short reaction times. For example, 100 grams of gallium metal was converted into 120 grams of high-purity gallium nitride powder, corresponding to a greater than 99.9% yield in five hours of reaction time.

Detailed characterizations of gallium nitride (GaN) powder prepared by these methods were performed and are reported herein. The purity of GaN powder prepared was greater than 99.9% pure, as analyzed by Glow Discharge Mass Spectrometry (GDMS). The morphology and structure of the resulting GaN powder were investigated by SEM and XRD. The optical properties of the product were characterized by cathodoluminescence (CL). Raman spectra were measured at room temperature to determine the quality of the GaN particles. The GaN produced was high purity, hexagonal polycrystalline material, composed of plate-like grains 1 to 20 μm in diameter.

The method for making Group III nitrides includes contacting a mixture that includes a Group III element, and one or more wetting agents, with a nitrogen atom source to form a Group III nitride composition. The wetting agents are typically selected from the group of bismuth, germanium, tin, and lead, or combinations thereof. When bismuth is used as a wetting agent, the procedure does not involve molecular beam epitaxy (MBE). MBE is optionally not employed in other embodiments of the invention.

Definitions

The following definitions are used, unless otherwise described.

A stated temperature refer to degrees Celsius at one atmosphere of pressure. The temperature of a reaction can be measured in either the gas or liquid phases. Typically, the reaction temperature is measured in the gas phase above the liquid phase, by a thermocouple placed within about 2 cm of the liquid phase.

As used herein, "nitride" refers to a compound containing a nitrogen atom covalently bonded to a more electropositive element.

As used herein, "Group III element" refers to an element that contains one electron in a p-orbital, wherein the p-orbital is the element's outermost valence orbital. The Group III elements are the elements boron (B), aluminum (Al), gallium (Ga), indium (In), and thallium (Tl). As used herein, a Group III element can also be a composition that contains a Group III element, or a metal alloy containing a Group III element. The Group III element can be a compound containing a Group III element, such as an organometallic compound, e.g. $Al(CH_3)_3$, or an inorganic compound containing a Group III element, e.g., GaCl. Suitable Group III compounds include, e.g., halides, oxides, sulfides, hydroxides, nitrates, arsenides, antimonides and phosphides. More specifically, Group III compounds can be, e.g., $(BH_3)$, borane complexes such as borane-methyl sulfide complex $(BH_3.S(CH_3)_2)$, a boron atom substituted with one or more alkyl groups, $BCl_3$, $BBr_3$, $BF_3$, $BI_3$, $B_2O_3$, $B(OH)_3$, $B(NO_3)_3$, BP, an aluminum atom substituted with one or more alkyl groups, $AlCl_3$, $AlBr_3$, $AlI_3$, $Al_2O_3$, $Al_2S_3$, $Al(OH)_3$, $Al(NO_3)_3$, AlAs, AlP, a gallium atom substituted with one or more alkyl groups, GaCl, $GaCl_2$, $GaCl_3$, $GaBr$, $GaBr_3$, $GaF_3$, GaI, $GaI_3$, $Ga_2O$, $Ga_2O_3$, $Ga_2S_3$, $Ga(OH)_3$, $Ga(NO_3)$, GaAs, GaP, GaSb, GaS, $Ga_2S$, an indium atom substituted with one or more alkyl groups, InCl, $InCl_2$, $InCl_3$, InBr, $InBr_3$, $InF_3$, InI, $InI_3$, $In_2O$, $In_2O_3$, $In(OH)_3$, $I(NO_3)$, InSb, a thallium atom substituted with one or more alkyl groups, TlCl, $TlCl_3$, TlBr, TlF, $TlF_3$, TlI, $Tl_2O_3$, $Tl_2S$, $Tl(OH)_3$, $Tl(NO_3)_3$, or $Tl_3As$. Any suitable and effective Group III compound can be employed. Many Group III compound are disclosed in, e.g., *Aldrich Handbook of Fine Chemicals,* 2003-2004 (Milwaukee, Wis.).

As used herein, "Group III nitride" refers to a compound containing nitrogen covalently bonded to a Group III element. Examples of Group III nitrides include boron nitride (BN), aluminum nitride (AlN), gallium nitride (GaN), indium nitride (InN), and thallium nitride (TlN).

As used herein, "Group III nitride composition" refers to a composition containing a Group III nitride, optionally including other elements, compounds, and dopants.

As used herein, "wetting agent" refers to an element or compound that facilitates the mixing of or a reaction between an otherwise immiscible liquid mixture at the interface of the two components. The wetting agent can be any metal that facilitates interfacial wetting of a binary liquid metal mixture and does not readily react to form covalent bonds with Group III elements. Any suitable and effective wetting agent compound can be employed. Suitable wetting agents include bismuth (Bi), lead (Pb), germanium (Ge), and tin (Sn). Other suitable wetting agents include antimony (Sb), tellurium (Te), and polonium (Po). The reaction mixture can also include a mixture of two or more wetting agents, in any proportion. The reaction mixture can include a wetting agent compound, such as organometallic compounds containing the wetting agent metal or inorganic compounds containing the wetting agent metal. Suitable wetting agent compounds include, e.g., halides, oxides, hydroxides, and nitrates. Many suitable and effective wetting agents and wetting agent compounds are disclosed, e.g., in *Aldrich Handbook of Fine Chemicals,* 2003-2004 (Milwaukee, Wis.). As used herein, nickel is not a wetting agent.

As used herein, bismuth, germanium, tin, and lead refer to elemental metals, alloys containing these metals, compounds containing these metals, and mixtures thereof.

As used herein, "nitrogen atom source" refers to any substance that can provide a reactive nitrogen atom that forms a chemical bond with a metal.

As used herein, "dopant" refers to a substance that is intentionally added, usually in small amounts, to a pure semiconductor material to alter its conductive properties, typically for use in semiconductors, transistors, and diodes. Suitable dopants include, e.g., beryllium (Be), magnesium (Mg), manganese (Mn), molybdenum (Mo), silicon (Si), and zinc (Zn). Other suitable dopants include rare earth elements, particularly cerium (Ce), samarium (Sm), dysprosium (Dy), erbium (Er), europium (Eu), promethium (Pm), thulium (Tm), and ytterbium (Yb). The dopant can be employed in the form of a pure (elemental) metal. Alternatively, the dopant employed can be in the form of a chemical compound or salt. Rare earth compounds that can be used as dopants, such as, e.g., europium chloride ($EuCl_3$), europium fluoride ($EuF_3$), europium nitrate ($Eu(NO_2)_3$), ytterbium fluoride ($YbF_3$). Suitable dopants also include, e.g., boron, aluminum, or indium, when the Group III element that is the major component of the reaction mixture is not B, Al, or In, respectively.

As used herein, an "alloy" refers to a homogeneous mixture or solid solution of two or more metals, the atoms of one replacing or occupying interstitial positions between the atoms of another.

As used herein, "shot" refers to essentially circular beads of about 0.5 to about 50 mm in diameter.

As used herein, an "ingot" refers to a bar or block of a metal or an alloy.

As used herein, a "powder" refers to a substance consisting of ground, pulverized, or otherwise finely dispersed solid particles.

As used herein, "monotectic temperature" refers to the fixed temperature at which two immiscible liquids are in equilibrium with a single solid.

As used herein, "consolute temperature" refers to the elevated temperature at which two immiscible liquids become miscible.

As used herein, "substantial decomposition" refers to the Group III nitride decomposing at a faster rate its formation by the reaction of the Group III element with a nitrogen atom source at a given temperature and pressure.

As used herein, an "impurity" refers to a material that is part of a compound or product mixture, of any amount, that is not the same as a recited element or compound.

As used herein, "alkyl" refers to both straight and branched monoradical hydrocarbons that can be optionally substituted and optionally unsaturated; but reference to an individual radical such as "propyl" embraces only the straight chain radical, a branched chain isomer such as "isopropyl" being specifically referred to.

As used herein, "cycloalkyl" refers to cyclopropyl, cyclobutyl, cyclopentyl, cyclohexyl, or cyclooctyl, and substituted versions thereof.

As used herein, "aryl" refers to a phenyl radical, an ortho-fused bicyclic carbocyclic radical having about nine to ten ring atoms in which at least one ring is aromatic, or a heterocyclic radical attached via a ring carbon of a monocyclic aromatic ring containing five or six ring atoms consisting of carbon and one to four heteroatoms each selected from the group consisting of non-peroxide oxygen, sulfur, and N(X) wherein X is absent or is H, O, ($C_1$-$C_8$)alkyl, phenyl or benzyl, as well as a radical of an ortho-fused bicyclic heterocycle of about eight to ten ring atoms derived therefrom, particularly a benz-derivative or one derived by fusing a propylene, trimethylene, or tetramethylene diradical thereto.

As used herein, "halo" or "halide" refers to a fluoro, chloro, bromo, or iodo radical.

As used herein, "halogen" refers to either a halide or fluorine, chlorine, bromine, or iodine as diatomic molecules.

As used herein, "reflux temperature" refers to the temperature at which at least one component of a liquid solution is converted into a vapor and is recondensed.

As used herein, "crystalline" refers to the atomic arrangement of a compound having regular arrangement of the atoms in a space lattice.

As used herein, "inert gas" refers to a gas that does not chemically react with the components of the reaction mixture. Examples of inert gases are nitrogen, helium, and argon.

As used herein, "substantially polycrystalline" refers to greater that about 50% of the crystals are of a particular polycrystalline form. Substantially polycrystalline can also refers to greater that 75%, preferably greater than 90%, and more preferably greater than about 95% of the crystals are of a particular polycrystalline form.

Group III Elements

Group III nitrides can be prepared by combining a Group III element, a wetting agent, and a nitrogen source to provide a reaction mixture. Typically, the Group III element is first combined with a wetting agent, to provide a first mixture. This first mixture includes a Group III element, wherein the Group III element is boron (B), aluminum (Al), gallium (Ga), indium (In), or thallium (Tl). Preferably, the Group III element is a Row 3, 4, or 5 element, e.g., Al, Ga, or In. More preferably, the Group III element is Ga. The invention also provides that the first mixture can include a mixture of two or more Group III elements, in any suitable and effective proportion.

The Group III element can be in any form convenient for its use in a reaction vessel. Typically the Group III element can be in form of one or more ingots, metal shot, or a powder. Depending on the reaction conditions employed, the Group III element can also be in one or more physical states, including solid, liquid, and gaseous states.

High purity Group III elements ensures high purity Group III nitrides. The Group III element can be at least about 99% pure by weight. Preferably, the Group III element can be at least about 99.9% pure by weight. More preferably, the Group III element can be about 99.9999% pure by weight.

Wetting Agents

Figure 4:
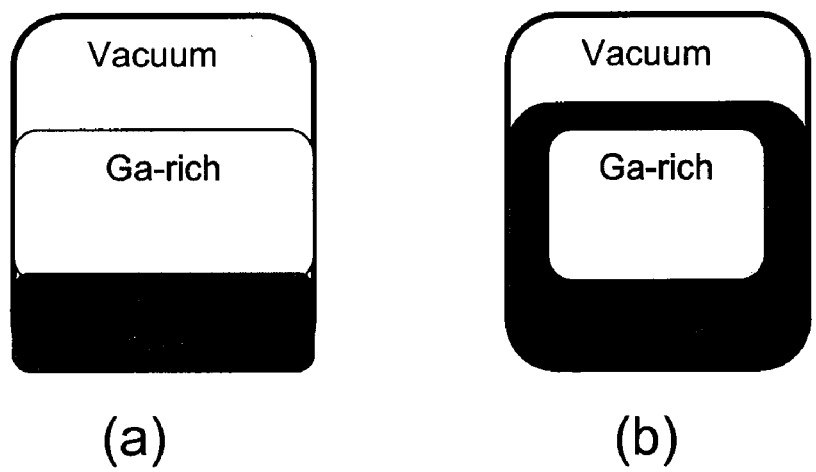
FIG. 4 illustrates Ga—Bi Alloy wetting (a) below and (b) above $T_{crit}$=262° C. (Courtesy of H. Tostmann). The high density phase completely wets the exposed surface by intruding between the low density phase and the gas phase.

An essential component of the preparation of Group III nitrides is a wetting agent. The wetting agent facilitates the mixing of, or miscibility of, two or more otherwise immiscible liquids at their interfaces. A wetting agent will completely wet the exposed surface of a molten Group III element by intruding between a molten Group III element and the gas phase of the reaction mixture. For example, gallium-bismuth alloy wetting is illustrated in FIG. 4. FIG. 4($a$) illustrates a Ga—Bi alloy below $T_{crit}$=262° C., and FIG. 4($b$) illustrates a Ga—Bi alloy above $T_{crit}$=262° C. (Courtesy of H. Tostmann). For a Ga—Bi system (FIG. 4($a$)), the high density phase (bismuth) is confined to the bottom of the container when the temperature is lower than the characteristic wetting temperature $T_{crit}$=262° C. Above this critical temperature (FIG. 4($b$)), the low surface tension component, bismuth, is present at the interface of the binary mixture. The high density phase completely wets the exposed surface by intruding between the low density phase and the gas phase. Typical wetting agents includes bismuth, germanium, tin, or lead.

In one specific embodiment, the wetting agent does not include bismuth. In another specific embodiment, the wetting agent does not include germanium. In one specific embodiment, the wetting agent does not include tin. In another specific embodiment, the wetting agent does not include lead. In another specific embodiment, the wetting agent does not include a metal salt.

The wetting agent can be in any form convenient for its use in a reaction vessel. Typically the wetting agent can be in the form of a powder, wire mesh, metal shot, or one or more ingots. Depending on the reaction conditions employed, the wetting agent can also be in one or more physical states, including solid, liquid, and gaseous states.

High purity wetting agents ensures high purity Group III nitrides. The wetting agent can be at least about 99% pure by weight. Preferably, the wetting agent can be at least about 99.9% pure by weight. More preferably, the Group III element can be about 99.999% pure by weight.

Dopants

The reaction mixture can optionally contain dopants. The selection of a particular dopant depends upon the desired characteristics of the Group III nitride composition to be prepared. Dopants are used to alter the conductive properties of an otherwise pure semiconductor, typically for use in semiconductors, transistors, and diodes. The dopant is typically used in less than about 5 weight % of the reaction mixture (Group III nitride and wetting agent), preferably in less than about 2 weight % of the reaction mixture, more preferably in less than about 1 weight % of the reaction mixture.

Reaction Mixtures

Typically the Group III element and the wetting agent are contacted to form a first mixture in a reaction vessel, such as a quartz or boron nitride boat. Alternatively, the Group III element and the wetting agent can be in the form of a metal alloy. It will be appreciated by one skilled in the art that the Group III element—wetting agent alloy can contain other components, such as catalysts or dopants. Any suitable and effective combination can be employed to form the first reaction mixture.

The Group III element and the wetting agent can be employed in any suitable and appropriate amount. The amount of wetting agent employed is dependant upon its effectiveness in wetting the group III metal and facilitating the formation of the Group III nitride. Typically, the wetting agent can be employed in a catalytic (sub-stoichiometric) amount, particularly when bismuth is employed as the wetting agent. The Group III element and the wetting agent can be present in a molar ratio of about 1:1 to about 500:1. Specifically, the Group III element and the wetting agent can be present in a molar ratios of about 2:1, or about 5:1, preferably about 20:1, and more preferably about 100:1, or about 200:1.

The main components of the reaction mixture include the Group III element, the wetting agent, and the nitrogen atom source. The order of mixing can be varied depending on the type of reaction mixture component used. For example, the Group III element can optionally be contacted with a nitrogen atom source prior to contacting the Group III element with the wetting agent. Alternatively, the wetting agent can be contacted with the nitrogen atom source prior to contacting the wetting agent with the Group III element. In one specific embodiment, borane-ammonia complex ($BH_3.NH_3$) can be used as both the Group III element and a nitrogen atom source. It should be noted that more than one specific nitrogen atom source can be used in any given embodiment.

Different methods of contacting the nitrogen source with the Group III element can be employed. Typically, a nitrogen atom source gas is passed over a heated mixture of the Group III element and the wetting agent. The mixture of the Group III element and the wetting agent can be contacted with the nitrogen atom source on the surface of the mixture. Alternatively, the nitrogen atom source can be contacted with the mixture at the interior of the mixture, for example, by forcing a gaseous nitrogen atom source into a liquid mixture of the Group III element and the wetting agent.

Purging

The Group III element and wetting agent are typically placed in a quartz, boron nitride, silicon carbide, or tantalum carbide reaction vessel. The vessel is typically either a furnace, or is contained in a furnace. Purging the reaction vessel with a flowing a gas allows for the removal of substances that can form impurities in the Group III nitride, particularly water and oxygen. Gases used for purging can be purified before purging the reaction vessel. Purification of the purge gas includes removing oxygen, water vapor, and other impurities. The reaction vessel is typically purged with hydrogen or an inert gas. Gases used for purging include, e.g., hydrogen, helium, argon, and nitrogen, or any combination thereof. For example, purging can be performed using hydrogen gas, either alone, or in combination with an inert gas. Heating a Group III metal under flowing hydrogen gas can help reduce any remaining trace amounts of Group III metal oxide on the metal surface.

The vessel is preferably purged until oxygen has been completely removed from the reaction vessel, chamber, or furnace. Purging the reaction vessel can be facilitated by first evacuating a sealed vessel to reduce its internal pressure before flowing the purge gas through the vessel. Generally, the purging can occur at any time and at any temperature before a nitrogen atom source is added. The Group III element and wetting agent are typically in a vessel that is purged by a flowing gas and is heated at the same time. The vessel can be purged for at least 10 minutes. Preferably, the vessel is purged for about 1-4 hours. Specifically, the vessel can be purged for about 1.5 hours.

Nitrogen Atom Source

The nitrogen atom source provides the nitrogen atom that becomes the reactive nitrogen species, which in turn reacts with the Group III element to form the Group III nitride. The nitrogen atom source can be a gas, liquid, or a solid. One specific nitrogen atom source is ammonia, initially added as either a liquid or a gas. Alternatively, the ammonia can be in the form of a complex or a salt. Any nitrogen atom source can be treated to remove impurities. For example, when ammonia gas is used as a nitrogen atom source, an ammonia purifier can be used to remove residual water vapor and oxygen (impurities).

Ammonia is a preferred nitrogen atom source, but other nitrogen atom source can be employed. The nitrogen source can be an amine substituted with one or more alkyl, cycloalkyl, or aryl groups. The nitrogen atom source can also be an ammonium salt, for example, an ammonium halide. Specific ammonium halides include ammonium fluoride, ammonium chloride, ammonium bromide, and ammonium iodide. The nitrogen atom source can also be ammonium hydroxide, hydrazine, or lithium nitride ($Li_3N$). Other alkali metal nitrides can also be used, such as sodium nitride, or potassium nitride. The nitrogen atom source can also include nitrogen-containing organometallic compounds or nitrogen-containing inorganic compounds. The nitrogen atom source can further be an alkali metal azide, e.g, lithium azide, sodium azide, or potassium azide.

The nitrogen atom source can produced by discharge of an electric arc through liquid nitrogen, or alternatively, gaseous nitrogen. As such, a nitrogen atom source can be produced as disclosed by Anders (A. Anders and S. Anders, *Plasma Sources Sci. Technol.* 1995, 4, 571). An arc discharge method can also be used to otherwise facilitate the production of the Group III nitride in the reaction mixture.

A liquid or gaseous nitrogen atom source can be passed over or through the reaction mixture. Various rates of passage over or though the mixture can be employed. One gas flow rate can be about 100-900 standard cubic centimeters per minute (sccm), or more preferably about 200-800 sccm. Specific flow rate can be about 400 sccm, about 500 sccm, or about 600 sccm.

Temperature and Duration Parameters

Heating the reaction mixture provides the energy required to convert solid reactants into liquids or gases, and to convert the reactants into products, e.g. Group III nitrides. Typically the mixture of the Group III element and the wetting agent are formed into a melt before the nitrogen atom source is added. For efficient conversion of the reaction mixture to a Group III nitride composition, the reaction must typically be heated to at least the monotectic temperature, and preferably, to at least the consolute temperature. Specifically, the mixture can be heated to at least about 262° C. before the nitrogen atom source is added. More specifically, the mixture can be heated to at least about 650° C. before the nitrogen atom source is added.

After the Group III element and wetting agent are contacted with the nitrogen atom source, the temperature is typically increased to a higher temperature. Specifically, the mixture can be heated to at least about 500° C. More specifically, the mixture can be heated to at least about 900° C., or alternatively to about 1000° C.

In certain embodiments, the mixture can be heated to a temperature less than that which causes substantial decomposition of the Group III nitride. For the preparation of GaN and InN compositions, one maximum temperature of the reaction is 1250° C. For the preparation of AlN compositions, one maximum temperature of the reaction is 1500° C. It will be appreciated by one skilled in the art that each Group III nitride composition possesses a temperature at which the nitride begins to decompose. Thus, to maintain high purity of the Group III nitrides produced, the reaction temperature should not be heated to a temperature higher than the decomposition temperature of the Group III nitride. For certain reaction components, the mixture can be heated to no greater than about 1100° C. before the nitrogen atom source is added, or alternatively about 1500° C. For other reaction components, the mixture can be heated up to about 2200° C. before the nitrogen atom source is added.

Various reaction mixtures require different durations to reach completion. The reaction mixture can be heated for at least 30 minutes after the mixture is contacted with the nitrogen atom source. Also, the mixture can be heated for about 1-20 hours, or more preferably for about 3-8 hours. In one specific embodiment, the mixture is for about 5 hours. The mixture can also be heated for up to about ten days. See for example, FIG. 3, which illustrates the yields of GaN powder plotted against reaction time in $NH_3$ at 1000° C. with 5 weight % Bi as the wetting agent.

Group III Nitride Composition

High purity Group III nitride can be prepared by the methods disclosed herein. The Group III nitride composition can be produced in greater than about 50% purity by weight. The Group III nitride composition can also be produced in greater than about 75% purity by weight. Typically, the Group III nitride composition is produced in greater than about 95% purity by weight. Preferably, the Group III nitride composition is produced in greater than about 99% purity by weight. More preferably, the Group III nitride composition is produced in greater than about 99.9% purity by weight. The percent purity by weight can readily be determined by those of skill in the art by glow discharge mass spectrometry (GDMS).

The Group III nitride composition formed can include two or more Group III nitrides. For example, GaN forms a continuous range of solid solutions with AlN and InN, separately or together. These combinations can be represented by, e.g., the following formulae: $Ga_xAl_{(1-x)}N$, $Ga_xIn_{(1-x)}N$, and $Ga_{x-}Al_yIn_{(1-x-y)}N$. The various combinations need not include gallium. The amount of substitution is determined by the properties desired in the resulting composition.

Figure 7:
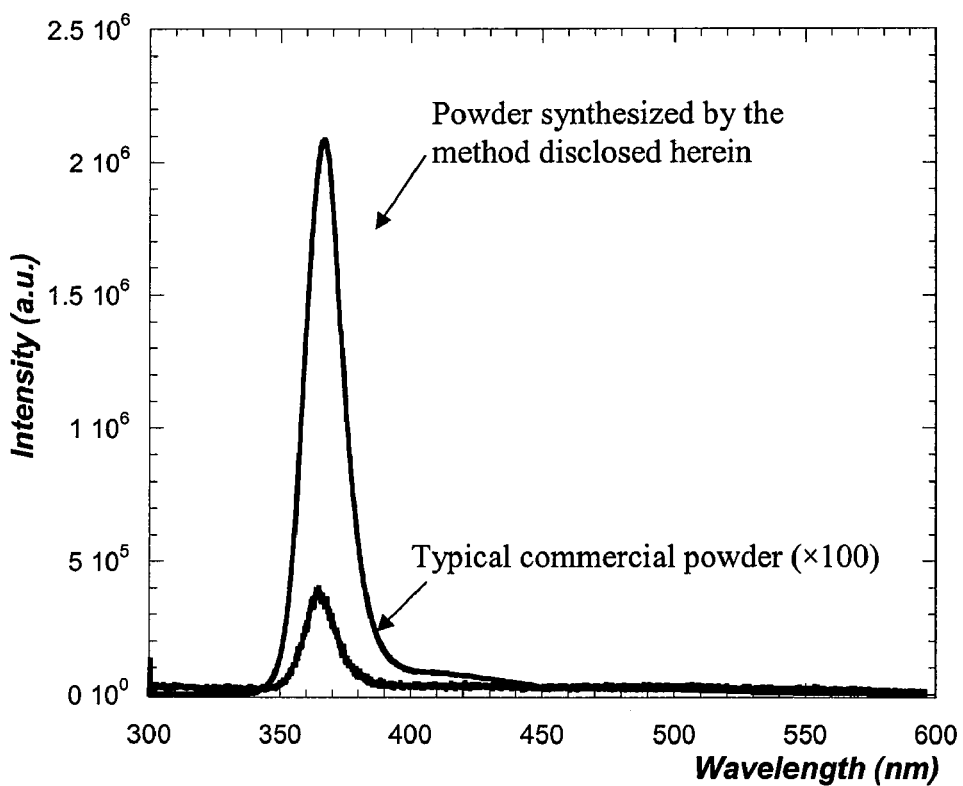
FIG. 7 illustrates a typical Cathodoluminescence (CL) spectrum of synthesized GaN powder at room temperature.
Figure 8:
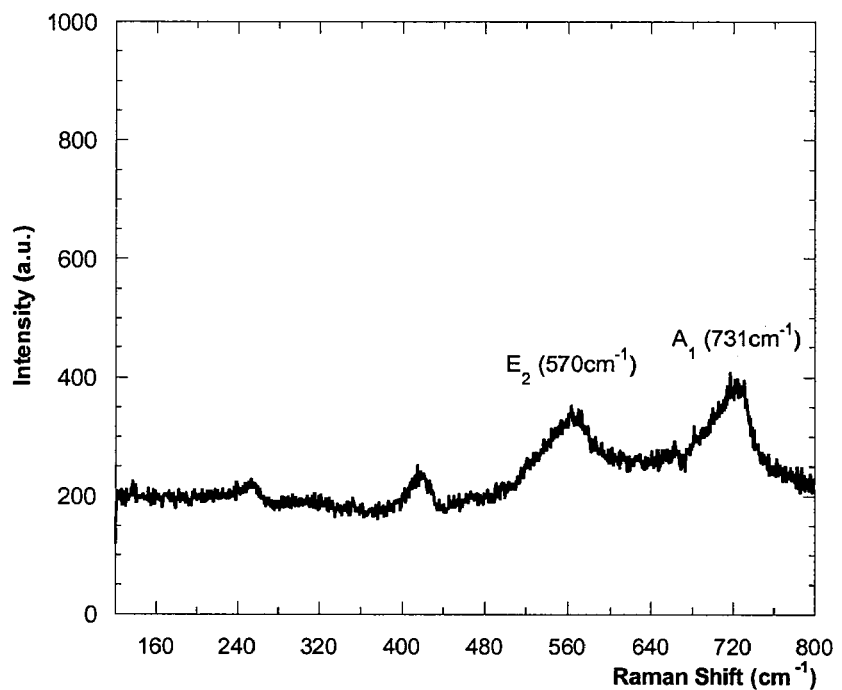
FIG. 8 shows Raman spectroscopy results of (a) commercial GaN powder vs. (b) synthesized GaN powder, each at room temperature.
Figure 8:
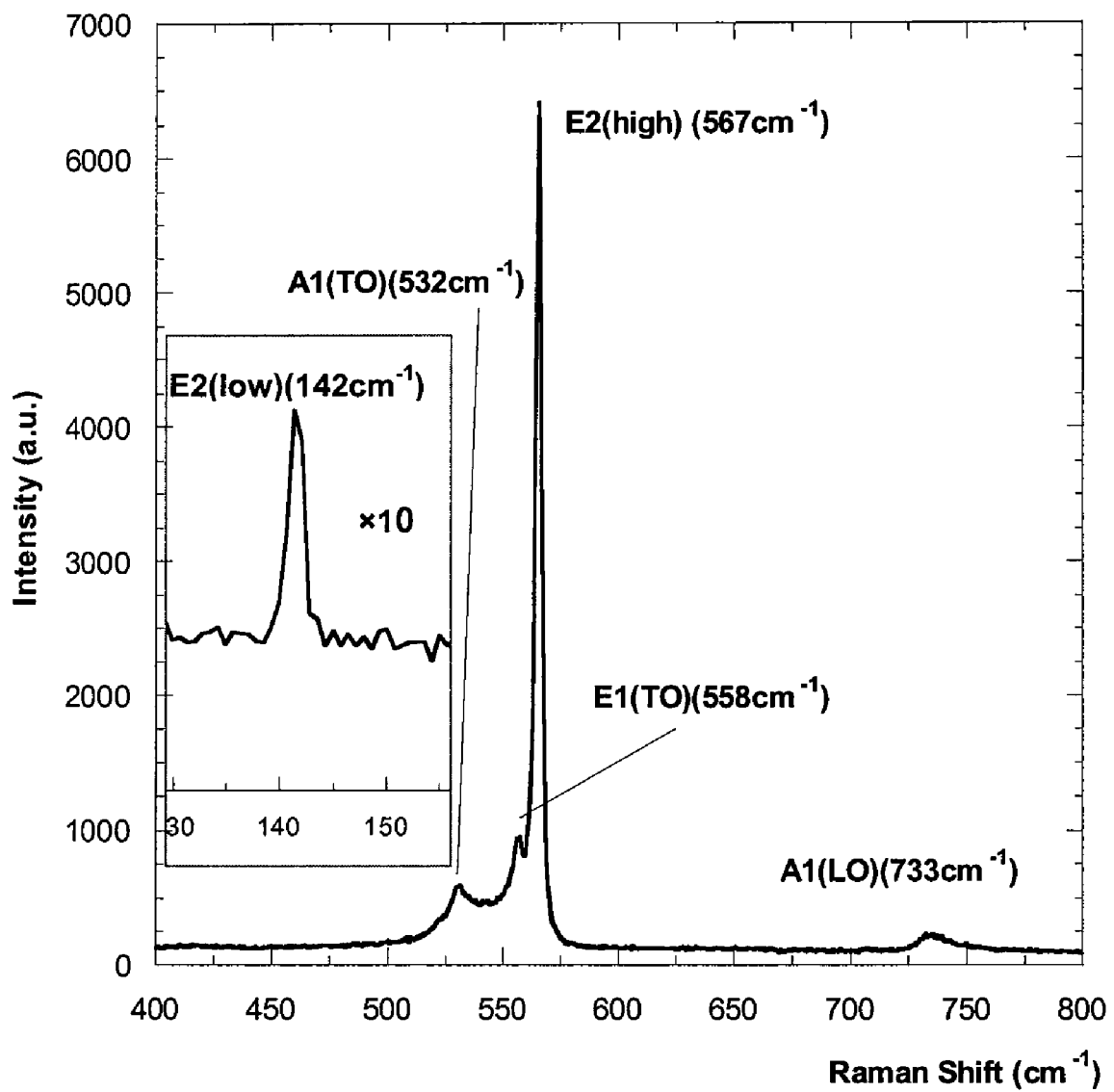

The Group III nitride composition can be further purified after the initial reaction is complete, for example by removing excess wetting agent from the Group III nitride formed. After this purification step, the Group III-nitride composition can be produced in greater than about 99% purity by weight, more preferably in greater than about 99.5% purity by weight. In certain embodiments, the Group III-nitride composition can be produced in greater than about 99.9% purity by weight. FIG. 7 illustrates a typical Cathodoluminescence (CL) spectrum of synthesized GaN powder at room temperature. FIG. 8 shows Raman spectroscopy of (a) commercial GaN powder vs. (b) synthesized GaN powder at room temperature. The GDMS results for a commercial powder and a GaN powder produced by the disclosed methods are both presented in Table 1 in the Examples section, below.

Figure 5:
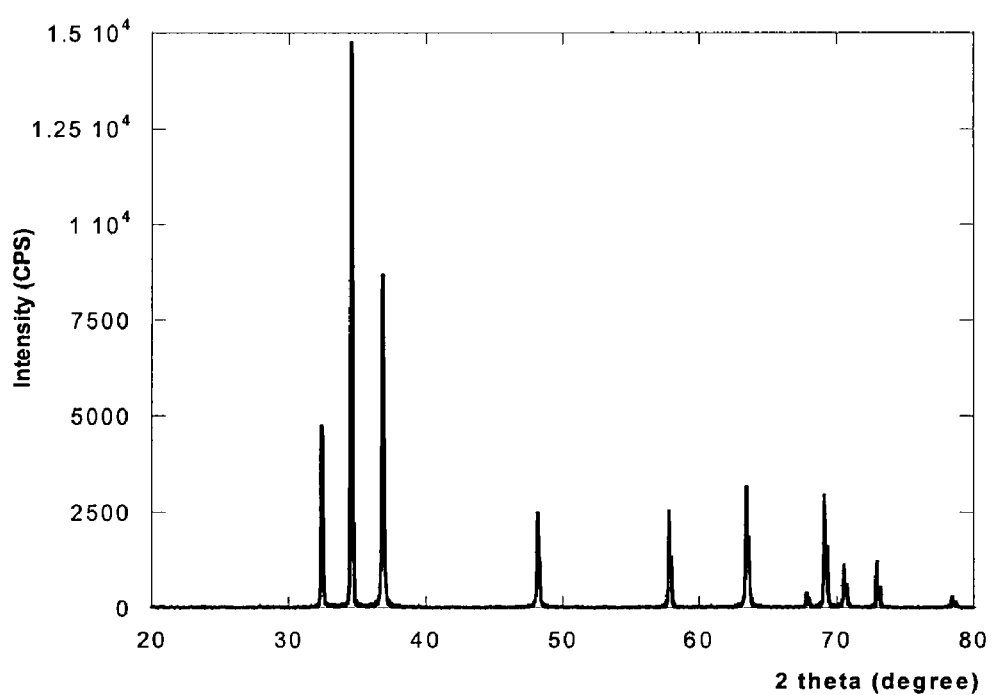
FIG. 5 illustrates a typical X-Ray Diffraction (XRD) pattern, using Cu $K_\alpha$ radiation, of GaN powder produced by the disclosed procedures after removal of bismuth. A typical θ-2θ scan mode XRD pattern of the powder after the removal of Bi is demonstrated.

The powder produced by the methods described is typically crystalline. Specifically, the Group III nitride composition can be substantially hexagonal polycrystalline. Alternatively, the Group III nitride composition can be substantially cubic polycrystalline. FIG. 5 illustrates a typical XRD pattern, using Cu $K_\alpha$ radiation, of GaN powder produced by the disclosed procedures after removal of a Bi wetting agent. A typical θ-2θ scan mode XRD pattern of the powder after the removal of Bi is illustrated in FIG. 5. The pattern corresponds well with that of hexagonal GaN reported in the ASTM X-ray powder data file. This GaN powder clearly shows a strong (0001) orientation because (0002) is the strongest observed peak.

Figure 6A:
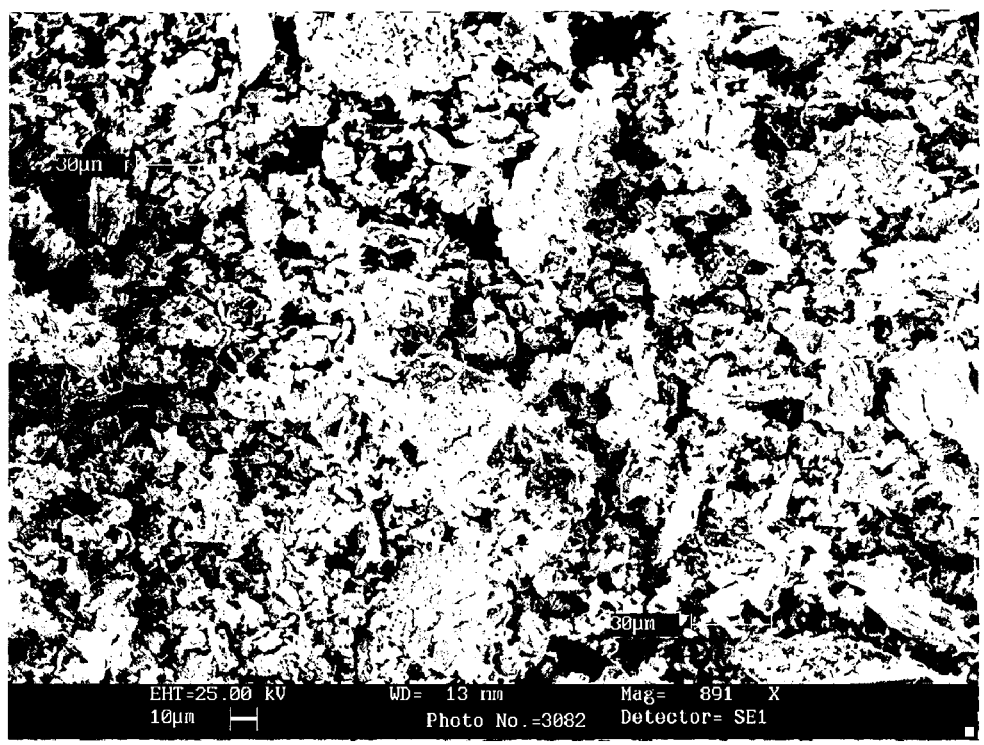
FIG. 6(*a*) illustrates a scanning electron microscopy (SEM) image of synthesized GaN powder, showing a 10 μm resolution bar.
Figure 6B:
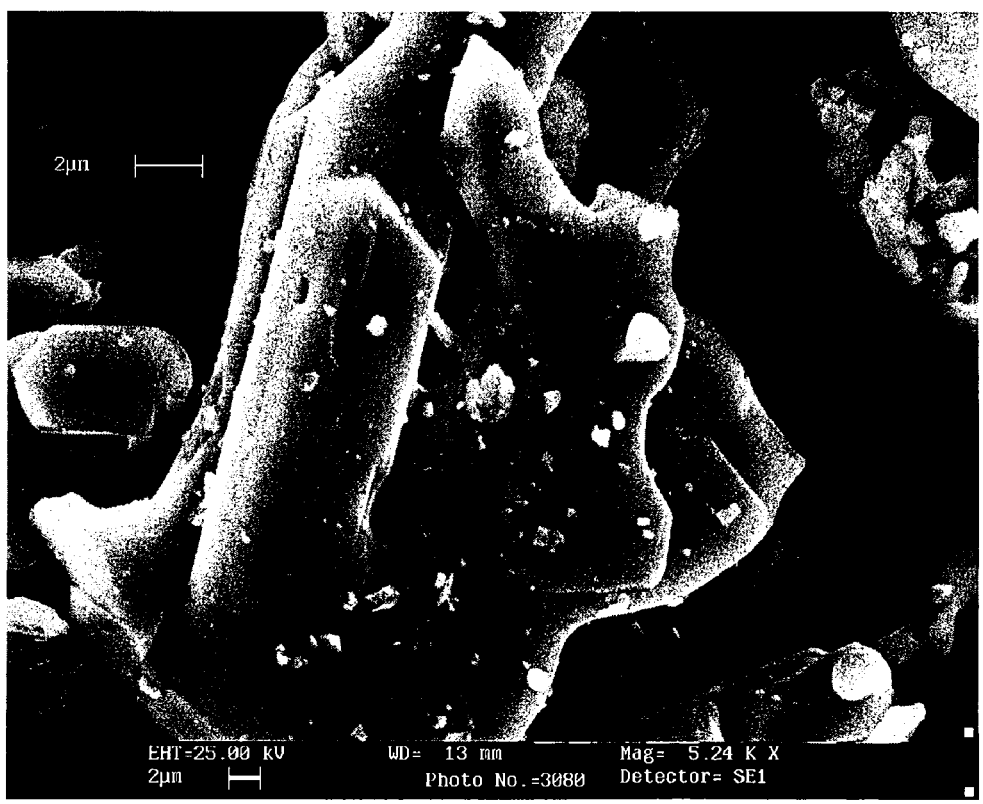

The powder formed from the Group III nitride composition can form crystalline plates. In one embodiment, the diameter of the plates can be about 0.1 to about 50 μm. The powder can also be plates of about 1 to about 20 μm in diameter. The Group III-nitride composition produced can form single crystals. FIG. 6(a) illustrates a scanning electron microscopy (SEM) image of synthesized GaN powder, showing a 10 μm resolution bar. FIG. 6(b) illustrates a SEM image of a large GaN plate, showing a 2 μm resolution bar.

Pressure

Altering the atmospheric pressure of the reaction mixture can change the temperature and duration required to produce the Group III nitrides compositions. The method can be conducted at pressures of less than one atmosphere. Specifically, the method can be conducted at pressures as low as about 10 Torr. Alternatively, the method can be conducted at pressures of greater than one atmosphere. Specifically, the method can be conducted at pressures as high as about 10,000 Torr. It will be appreciated by the skilled artisan that specific pressures between about 10 Torr and about 10,000 Torr can also be employed. Certain specific pressures include any of about 2, 4, 6, 8, or 10 atmospheres. Lower reaction temperatures can optionally be employed when the reaction is conducted under pressure (e.g., about 550° C.). Also, higher temperatures can optionally be employed when the reaction is conducted under reduced pressures.

The Group III nitride composition is typically produced in extremely high purity, as determined by Glow Discharge Mass Spectrometry (GDMS) and X-Ray Diffraction (XRD) analysis. Various methods can be employed to further increase the purity by removing the wetting agent. The Group III nitride composition formed by the methods disclosed herein is typically cooled to ambient temperature before further purification, but cooling is not always required.

For convenient handling of the Group III nitride, the composition is typically formed into a powder. The powder formation process can be performed under a suitably inert atmosphere to prevent oxidation or hydration of sensitive substrates. The Group III nitride composition can be formed into a powder by crushing, for example, using a mortar and pestle. The skilled artisan will appreciate that powders of various grain sizes can be readily prepared. A powder can be formed into particles as small as about one micron in diameter. The Group III nitride can also be formed into a powder, wherein the powder includes ultrafine particles, e.g., particles of less than about 0.1 μm in diameter. Ultrafine particles are important because such particles typically possess optical and mechanical properties different than those of the corresponding bulk materials.

Purification Techniques

I. Evaporation

One method of purifying the Group III nitride composition powder formed is by heating under a flowing gas to remove the wetting agent after the reaction process. Specifically, the powder can be heated under ammonia gas. Typically, the Group III nitride composition powder can be heated to at least about 800° C. Specifically, the Group III nitride composition powder can be heated to at least about 1000° C. In one specific embodiment, the Group III nitride composition powder can be heated to about 1030° C. Alternatively, the Group III nitride composition powder can be heated to up to about 1500° C. For the preparation of a GaN composition, the GaN composition powder can be heated up to about 1250° C.

The duration of heating can influence the level of purity. In one embodiment, the Group III nitride composition powder is heated for at least 30 minutes under a gas. In another embodiment, the Group III nitride composition powder is heated for about 5 hours under a gas, for example, ammonia gas.

II. Oxidative Purification

One alternative means of purifying the Group III nitride powder is by contacting the powder with a solvent or solvent system, oxidizing the wetting agent to form a soluble compound, followed by removing the soluble oxidized wetting agent. For example, the Group III nitride composition powder can be contacted with one or more solvents and one or more oxidants to form a solution of the oxidized wetting agent, followed by physically separating oxidized wetting agent from the solid Group III nitride powder.

The solvent or solvents preferably dissolve the oxidized wetting agent. The solvent or solvents used to dissolve the wetting agent include an alkyl, cycloalkyl, or aryl, optionally substituted with one or more polar groups, wherein the alkyl or cycloalkyl is optionally partially unsaturated, and wherein the alkyl or cycloalkyl is optionally interrupted with one or more oxy, amino, or thio groups. Examples of polar groups are, e.g., hydroxyl, amino, thio, and halo substituents. In one specific embodiment, one solvent can be ethanol.

The oxidant can a halogen, or alternatively, any suitable and effective oxidizing agent. Specifically, the oxidant can be iodine.

Elevated temperatures can be employed to facilitate the dissolution of the oxidized wetting agent. The first solution can be heated under refluxing conditions, e.g., about one hour to about two days. Preferably, the first solution can be heated for about one day. The separation of the Group III nitride and the oxidized wetting agent can be achieved by filtration.

The powder can be dried to remove any remaining solvent or solvents. Preferably, the powder is dried to remove all recognizable traces of the solvents, for example, as analyzed by GDMS. Further removal of remaining oxidant from the Group III nitride composition can also be performed, as necessary.

III. Dissolution

The Group III nitride composition can be purified by dissolving unreacted Group III metals and wetting agents in an acid. Specifically, the acid can be hydrochloric acid, or a nitric acid/hydrofluoric acid combination. Alternatively, a mixture of hydrochloric acid and hydrogen peroxide solution can be used. Each technique can be followed by aqueous rinses and drying.

Reaction Apparatus

Figure 2:
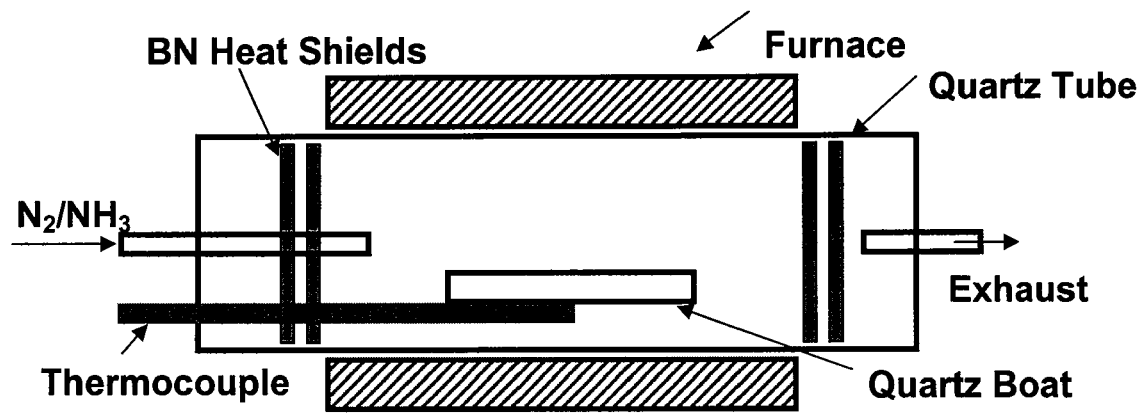
FIG. 2 illustrates a schematic view of a horizontal furnace used for preparing Group III nitrides.

The vessel used for producing the Group III nitride composition can be a furnace, or optionally be a vessel contained in a furnace. FIG. 1 illustrates a schematic view of a vertical furnace used for preparing Group III nitrides. FIG. 2 illustrates a schematic view of a horizontal furnace used for preparing Group III nitrides. The vessel containing the Group III nitride and the wetting agent mixture can be a quartz vessel. Alternatively, the vessel can be made of, or is lined with, boron nitride, graphite, SiC coated graphite, TaC coated graphite, molybdenum, tungsten, or TaC.

The reaction mixture can be agitated to facilitate mixing. Agitation can be achieved by stirring or shaking. Agitation or mixing can also be performed by other methods, such as through microwave irradiation or by producing a centripetal or centrifugal force upon the reaction mixture.

Additional Methods

The method of making Group III nitrides disclosed herein can include various optional steps. For example, the invention provides a method for making a Group III nitride composition, the method comprising: (a) heating a first mixture comprising a Group III element or a compound containing a Group III element, and one or more wetting agents selected from the group of bismuth, germanium, tin, and lead, or a compound thereof, in any combination, to a temperature and for a period of time, sufficient to liquefy at least a portion of the Group III element, thereby providing a second mixture; (b) contacting the second mixture with a nitrogen atom source to provide a third mixture; and (c) heating the third mixture to a temperature and for a period of time, sufficient to form a Group III-nitride composition.

In another embodiment, the invention provides a method for making a Group III nitride composition, the method comprising: (a) contacting a Group III element or compound and a wetting agent to provide a first mixture; (b) heating the first mixture to a temperature that changes at least some of the first mixture to a liquid state to provide a second mixture; (c) contacting the second mixture with a nitrogen atom source; (d) heating the second mixture and the nitrogen atom source up to about 1500° C. for a sufficient amount of time to form a Group III nitride composition.

The invention also provides a method for making a Group III nitride composition, the method comprising: (a) contacting a Group III element or compound and a wetting agent to provide a first mixture; (b) heating the first mixture to about 650° C.; (c) contacting the first mixture with a nitrogen atom source; (d) heating the first mixture and the nitrogen atom source up to about 1000° C. for a sufficient amount of time to form a second mixture; (e) allowing the second mixture to cool; (f) forming the second mixture into a powder; and (g) heating the powder under ammonia for a time and temperature sufficient to evaporate at least a portion of the wetting agent or any other impurity removable by such method.

The methods described herein can be employed for the preparation of other Group III-Group V compounds, such as Group III phosphides, arsenides, and antimonides, by using an appropriate and suitable Group V atom source in place of the nitrogen atom source. Furthermore, the process can also be used for the preparation of transition metal nitrides and rare earth element nitrides, by using suitable and effective transition metals or rare earth elements in place of the Group III elements. For example, titanium, vanadium, chromium, niobium, and tantalum nitrides can be prepared by replacing the Group III element with the appropriate transition metal or rare earth element, and following the method for preparing Group III nitrides, and alternatively, phosphides, arsenides, and antimonides.

EXAMPLES

Example 1

General Gallium Nitride Preparation Methods

Methods and Materials:

The starting materials used were 99.9999% pure gallium shot from Eagle-Picher Technologies, LLC., 99.999% bismuth shot from Spex Industries, and 99.9999% ammonia from Airgas Inc. An ammonia purifier was used to remove residual water vapor and oxygen from the $NH_3$ gas. Twenty-five grams of Ga shot was mixed with varying mole fractions of Bi in a quartz tube 5 cm in diameter and 25 cm deep. Because the Ga was added as a solid piece, Bi was distributed above and below it to ensure rapid mixing upon melting. The quartz tube was loaded into a vertical furnace. A schematic view of the system is illustrated in FIG. 1. A matrix of temperatures (900-1050° C.), $NH_3$ flow rates (200-800 sccm), Bi concentrations (0-20% mole fraction) and reaction times (3-6 hours) was investigated to optimize the synthesis.

After purging the tube with $N_2$ for 1 hour, the sample was heated under flowing $N_2$. When the melt temperature reached 650° C., the gas was switched from $N_2$ to $NH_3$, and then the furnace was heated in one hour to the desired reaction temperature. After the reaction, the sample was allowed to cool to room temperature under flowing $NH_3$. The material was removed from the boats, crushed and slightly ground with a mortar and pestle. Twenty-five grams of metal Ga were fully converted into approximately 30 grams of high purity GaN (>99% yield) within 3-6 hours. The Bi was easily removed after powder formation by one of the two purification methods discussed below. No further purification of the powder was necessary. In one embodiment of the invention, the optimum conditions for the complete conversion of the Ga into GaN were a reaction temperature of 1000° C., 500 sccm $NH_3$ flow, 0.5% mole fraction Bi, and 5 hours reaction time. Higher Bi concentrations also resulted in complete conversion to GaN under similar conditions, but minimal Bi content is desired to produce the highest purity material.

Results and Analysis:

I. Without a Wetting Agent:

Initial experiments used pure gallium metal as the reactant with no Bi added. Even after 24 hours of reaction with $NH_3$ at 1000° C., only a thin GaN crust was formed on the surface of the melt. The yield of GaN powder was estimated to be lower than 1% after removing the large excess of Ga via etching with hydrochloric acid.

At first, it was suspected that the low yield might have resulted from the metal Ga poorly wetting the surface of the quartz tube. Thus, the surface was roughened to improve the wetting of metal Ga inside the quartz tube. However, liquid metal Ga was still confined by the thin GaN layer. The GaN crust over the molten Ga appeared to be continuous with no visible cracks or holes, apparently preventing $NH_3$ from reaching the Ga below. Because the crust inhibited further GaN production, the diffusion of Ga or N through the solid GaN in the crust must be very slow at these temperatures.

II. With a Bi Wetting Agent

Several candidate metals were screened to find the best potential catalyst for Ga conversion: Bi, Ge, Sn and Pb. For both Ga-50% Sn and Ga-50% Pb, only a thin GaN crust was produced on top of the molten alloy. The gallium in both the Ga-50% Ge and Ga-50% Bi alloys had almost completely reacted at 900° C. under flowing $NH_3$. However, with only a 10% molar fraction of Ge, the metal Ga was only partially converted into GaN, while with 10% Bi, the metal Ga reacted completely. Thus, Bi was selected as the catalyst for further study.

Figure 3:
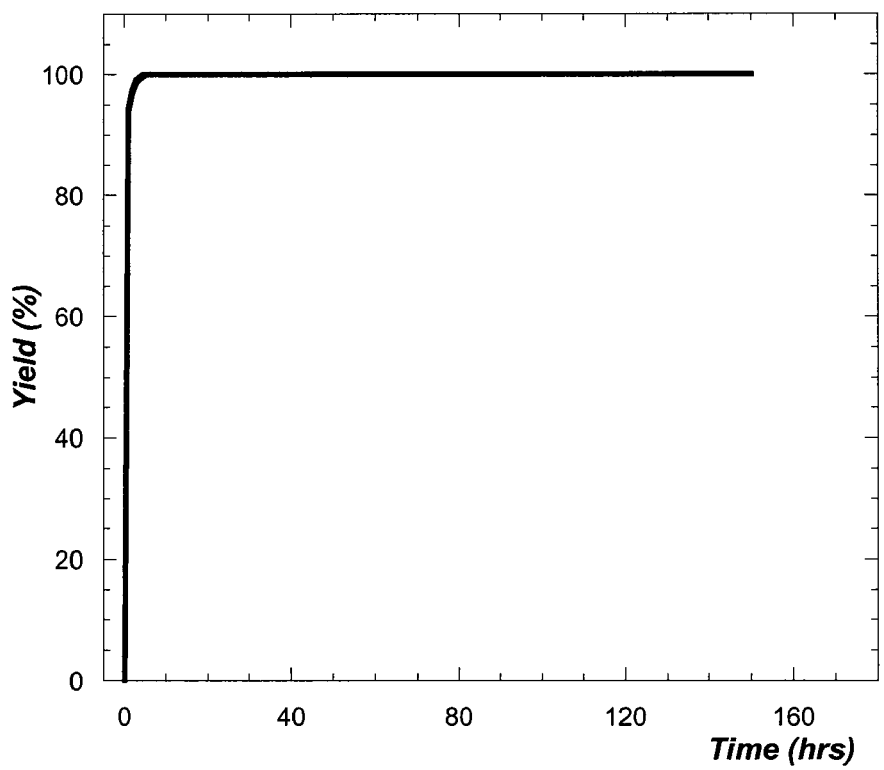
FIG. 3 illustrates yields of gallium nitride powder plotted against reaction time under ammonia gas at 1000° C. with 5 molar % bismuth as the wetting agent.

The Bi ratio, temperature, $NH_3$ flow and reaction time were varied to determine the optimum conditions to synthesize the GaN powder. In marked contrast to the experiments with pure Ga, all the gallium reacted completely with $NH_3$ at 900-1050° C. within 3-6 hours. With a high ratio of Bi in the alloy (>5%), Ga was fully converted into GaN throughout the temperature range 900-1050° C., within 3 hours. The production of GaN from Ga-5% Bi alloys for reaction times from 1 hour to 1 week was explored at 900° C. The dependence of yield of GaN on reaction time is shown in FIG. 3. Surprisingly, most of the Ga was converted to GaN in only one hour after reaching 900° C. The powder was gray to dark gray because of the remaining Bi. The powder color became progressively lighter as the Bi concentration was decreased. The particle shape and size varied with different Bi concentrations. Needle-like crystals were common at high Bi concentrations, while plate-like particles predominated at low Bi concentrations. One set of optimum conditions are 0.5% Bi, 1000° C., 500 sccm $NH_3$ flow and 5 hours reaction. The powder produced was off-white to light gray. This material was selected for further detailed characterization.

For the Ga—Bi system, the high density phase (Bi) is confined to the bottom of the container when the temperature is lower than the characteristic wetting temperature $T_{crit}$=262° C.; see FIG. 4(a). Above this critical temperature, the low surface tension component, Bi, is present at the interface of the binary mixture. The high density phase completely wets the exposed surface by intruding between the low density phase and the gas phase; see FIG. 4(b). Even in Ga-rich alloys of Ga—Bi, Bi is highly concentrated on the surface of the Ga-rich liquid to form a film that is at least 30 Å thick at temperatures higher than 262° C. (Tostmann, et al. *Phys. Rev. Lett.* 2000, 84, 4385). This Bi layer apparently prevents GaN crust formation and facilitates the full, rapid conversion from Ga to GaN.

III. Removal of Bi (Purification Processes):

To remove the residual Bi from the GaN powder, two methods have been developed. The first method is an overnight reflux of the powder with iodine in ethanol. The bismuth iodide is then removed from the mixture by vacuum filtration.

An alternate, and potentially more efficient, method of Bi removal is to heat the powder to 1030° C. under flowing $NH_3$ gas for 5 hours. At this temperature, the Bi equilibrium vapor pressure is about 1200 Pa, more than 1000 times greater than that of Ga, a mere 1 Pa. Bi was easily removed by evaporation while the $NH_3$ passed over the mixture prevented GaN from decomposing. The powder color was lighter after this annealing process, and the small Bi peak in the powder XRD pattern disappeared.

IV. Characterization:

The crystalline quality of the GaN powder was characterized by using a Scintag XDS 2000 powder X-ray diffractometer with a 1.8 kW sealed copper X-ray source. The surface morphology of the GaN powder was observed by scanning electron microscopy (SEM). Cathodoluminescence was performed as an additional screen of purity. Raman spectroscopy was carried out at room temperature. GDMS was used by Shiva Technologies Inc. to analyze the purity of the GaN powder.

X-ray Diffraction: The GaN powder synthesized via the reaction of Ga and $NH_3$ with the Bi catalyst was examined by XRD using Cu $K_\alpha$ radiation. Once the Bi was removed, only GaN peaks were observed in the pattern. No free Ga or other phases were detected. FIG. 5 demonstrates a typical θ-2θ scan mode XRD pattern of the powder after the removal of Bi. The pattern corresponds well with that of hexagonal GaN reported in the ASTM X-ray powder data file. The GaN powder clearly has a strong (0001) orientation because (0002) is the strongest observed peak.

Scanning electron microscopy: FIG. 6(a) shows an SEM image of GaN powder grown under optimum conditions. The particle size distribution was 1-10 μm, with a majority of the particles around 2 μm. While several particle morphologies were observed (plates, polyhedra, and needles), the predominant shapes were plates, corresponding to the XRD result with (0002) as the highest peak. Some GaN plates are very large, more than 20 μm in diameter and 5 μm thick; see FIG. 6(b). The mechanism for this preferential plate growth is under investigation.

Cathodoluminescence: The optical properties of GaN powder synthesized by this method were investigated using cathodoluminescence at room temperature. Typical commercial powder was characterized at the same conditions for comparison. The excitation source was a 5 KeV electron gun focused to a 5 mm diameter spot. FIG. 7 is CL spectrums measured at room temperature for GaN powder synthesized by a procedure of this invention and typical commercial powder. The spectrum of our powder showed a strong band edge emission at 3.46 eV without a deep level yellow emission. The luminescence at 3.46 eV measured at room temperature has a full width at half maximum (FWHM) of approximately 50 meV. Typical commercial powder showed much less intensity compared to our powder. For easy comparison, the intensity of commercial powder has been amplified by 100 times in the figure. Clearly, the intensity of our powder is 500 times larger than the commercial powder at the same measure conditions. This excellent luminescence property of our powder indicates the growth of high crystalline GaN.

Raman Spectroscopy: Raman scattering measurements were carried out at room temperature using a triple monochromator Raman system equipped with a charge coupled detector. An Ar$^+$ laser ($\lambda$=514.5 nm) was used as the source of excitation. The typical laser spot size was 1 μm and the spectral resolution was approximately 2.5 cm$^{-1}$. The power on the sample was 50 mW. FIGS. 8(*a*) and (*b*) show the Raman spectra of the typical commercial powder and the GaN powder made through the processes of this invention.

The Raman spectrum of the synthesized GaN powder was consistent with other reports in the literature (E. V. Konenkova, Y. V. Zhilyaev, V. A. Fedirko, D. R. T. Zahn, *Appl. Phys. Lett.* 2003, 83, 629; F. A. Ponce, J. W. Steeds, C. D. Dyer, G. D. Pitt, *Appl. Phys. Lett.* 1996, 69, 2650; B. J. Skromme, K. C. Palle, C. D. Poweleit, H. Yamane, M. Aoki, F. J. DiSalvo, *Appl. Phys. Lett.* 2002, 81, 3765; V. Yu. Davydov, Yu. E. Kitaev, I. N. Goncharuk, et. al, *Phys. Rev. B.* 1998, 58, 12, 899). It corresponded to the following classifications and frequencies: E2 (low) at 142 cm$^{-1}$, A1 (TO) at 532 cm$^{-1}$, E1 (TO) at 558 cm$^{-1}$, E2 (high) at 567 cm$^{-1}$, A1 (LO) at 733 cm$^{-1}$. The Raman signals from the commercial powder were weak and only E2 (high) and A1 (LO) peaks appeared clearly there. Therefore, this indicates a much better quality of GaN powder produced through the method reported here, compared to commercial GaN powder.

Glow Discharge Mass Spectrometry: Glow discharge mass spectrometry (GDMS) is an extremely powerful tool for performing trace and ultra-trace elemental analysis on inorganic solid materials. As a direct solid sampling technique it is capable of reaching detection limits far below most other analytical techniques. Typical commercial powder and our powder were analyzed by GDMS by Shiva Technologies Inc. The GDMS results for both commercial powder and powder produced by the disclosed methods are presented in Table 1.

The typical commercial powder contained oxygen and carbon impurity concentrations above the measurement limits of GDMS, indicating that each constituted more than 3-5% by weight. It is clear that the carbon and oxygen levels were decreased dramatically in the synthesized GaN powder. The relatively higher Al and Si concentrations in our GaN powder results from the quartz tube used in the experiments. The high Bi concentration reflected the fact that the Bi removal process was not performed in this test sample. However, this Bi could be efficiently eliminated by the evaporation process discussed previously.

Based on the GDMS analysis, the overall purity of the typical commercial powder was worse than 94% (at least 3% oxygen and 3% carbon). However, the GaN powder made through the method disclosed herein could achieve 99.9% and even 99.99% purity if Bi was removed and Al and Si contamination from quartz were avoided by using a boron nitride (BN) boat. To current knowledge, the GaN powder produced by this disclosed procedure possesses a higher purity than any previously reported in the literature.

Discussion:

Gram-scale quantities of GaN powder were synthesized reproducibly by adding Bi as a catalyst. One hundred grams of gallium metal has been successfully converted into 120 grams of high-purity GaN powder. Larger scales can be achieved with larger quartz tubes and furnace sizes.

The Bi catalyst was very effective at increasing the growth rate of GaN powder. This is an economically viable process to produce high purity, single phase, and highly luminescent GaN powder. One set of optimal synthetic conditions are: 0.5% mole fraction of Bi, 1000° C., 500 sccm NH$_3$ flow and 5 hours reaction time. The powder was characterized by XRD and identified as hexagonal GaN. SEM images revealed the powder consisted of fine crystals of 1-10 μm. The CL spectrum was also measured at room temperature and only a strong band-edge emission of GaN was observed. The results from GDMS analyses indicated very high purity GaN powder. The synthesized material is to be used as the source

TABLE 1

GaN Powder purity analysis by GDMS. (Analyzed by Shiva Technologies, Inc.)

| Element | Invention Concentration [ppm wt. %] | Commercial Concentration [ppm wt. %] | Element | Invention Concentration [ppm wt. %] | Commercial Concentration [ppm wt. %] |
|---|---|---|---|---|---|
| B | 3.3 | 5.2 | Zn | 0.12 | 2.7 |
| C | ~50 | —* | Br | <0.1 | 20 |
| O | ~650 | —* | Zr | 0.12 | <0.05 |
| Na | 1.3 | 2.5 | Mo | <0.05 | 1.2 |
| Mg | 0.83 | 5.6 | Rh | <0.05 | <1 |
| Al | 210 | 19 | Ta | <100 | <20 |
| Si | 380 | 58 | W | <0.05 | 0.18 |
| P | 0.42 | 1.5 | Bi | 420 | <0.1 |
| S | 2.1 | 180 | Pt | <0.05 | =<14 |
| Cl | 11 | 78 | Pb | <0.05 | <1 |
| K | 4.1 | <0.05 | Sn | <0.05 | <5 |
| Ca | 0.58 | 2.6 | Sb | <0.05 | <3 |
| Ti | 3.7 | 0.16 | Te | <0.05 | <5 |
| Cr | 1.2 | 0.71 | I, Cs, Ba, La, Ce, Pr, Nd, Sm, Eu, Gd, Tb, Dy, Ho, Er, Tm, Yb, Lu, Hf, Re, Os, Ir, Tl, Sc, Sr, Y, Nb | <0.05 | <0.05 |
| Mn | 0.07 | <0.01 | | | |
| Fe | 8.3 | 4.6 | | | |
| Co | <0.01 | 0.16 | Ge, As, Se, Rb, V, Ru, Au, Hg, Ag, Cd, Li | <0.1 | <0.1 |
| Ni | 0.5 | 0.91 | | | |
| Cu | 0.07 | 16 | | | |

"—" indicates that the concentration of the element exceeded the measurement range of the GDMS, typically greater than 3-5%. Indium concentration is not shown in the table because it was present in the binder material.

material for the growth of bulk crystals using sublimation. Given its excellent luminescence, this GaN powder could also be used in organic LEDs.

Example 2

Specific Gallium Nitride Preparation, Purification #1

Twenty-five grams 99.9999% pure Ga shot was mixed with 0.5% mole fraction 99.999% pure Bi in a quartz tube (5 cm in diameter and 25 cm deep). The Ga was added as a solid piece, and Bi was distributed above and below it to ensure rapid mixing upon melting. The quartz tube was loaded into a vertical furnace similar to that illustrated by the schematic in FIG. 1.

After purging the tube with $N_2$ for 1 hour, the sample was heated under flowing high purity $N_2$. When the melt temperature reached 650° C., the gas was switched from $N_2$ to 99.9999% pure $NH_3$ gas at a flow rate of 500 sccm. An ammonia purifier was used prior to $NH_3$ addition to remove residual water vapor and oxygen from the $NH_3$ gas. The furnace was then heated in one hour to 1000° C. After five hours, the sample was allowed to cool to room temperature under flowing $NH_3$. The material was removed from the boats, crushed and slightly ground with a mortar and pestle.

Twenty-five grams of metal Ga were fully converted into approximately 30 grams of high purity GaN (>99% yield) in five hours. The remaining Bi was easily removed after powder formation by heating the powder to 1030° C. under flowing $NH_3$ gas for 5 hours. The powder color was lighter after this annealing process, and the small Bi peak in the powder XRD pattern disappeared.

Example 3

Specific Gallium Nitride Preparation, Purification #2

Twenty-five grams 99.9999% pure Ga shot was mixed with 0.5% mole fraction 99.999% pure Bi in a quartz tube (5 cm in diameter and 25 cm deep). The Ga was added as a solid piece, and Bi was distributed above and below it to ensure rapid mixing upon melting. The quartz tube was loaded into a vertical furnace similar to that illustrated by the schematic in FIG. 1.

After purging the tube with $N_2$ for 1 hour, the sample was heated under flowing high purity $N_2$. When the melt temperature reached 650° C., the gas was switched from $N_2$ to 99.9999% pure $NH_3$ gas at a flow rate of 500 sccm. An ammonia purifier was used prior to $NH_3$ addition to remove residual water vapor and oxygen from the $NH_3$ gas. The furnace was then heated in one hour to 1000° C. After five hours, the sample was allowed to cool to room temperature under flowing $NH_3$. The material was removed from the boats, crushed and slightly ground with a mortar and pestle.

Twenty-five grams of metal Ga were fully converted into approximately 30 grams of high purity GaN (>99% yield) in five hours. The remaining Bi was easily removed after powder formation by an overnight reflux of the powder with iodine in ethanol. The bismuth iodide was then removed from the solution by vacuum filtration.

Example 4

Gallium Nitride Prepared in a Boron Nitride Boat

In this example, a BN boat was used as the reaction vessel. The method of Example 2 was used, except where noted below. The reactants were metal gallium (25 g), bismuth (0.757 g (1 mol %)), and purified ammonia gas. The reaction temperature was 1000° C., the reaction time was 4 hours, and the $NH_3$ flow rate was 600 sccm.

Figure 9:
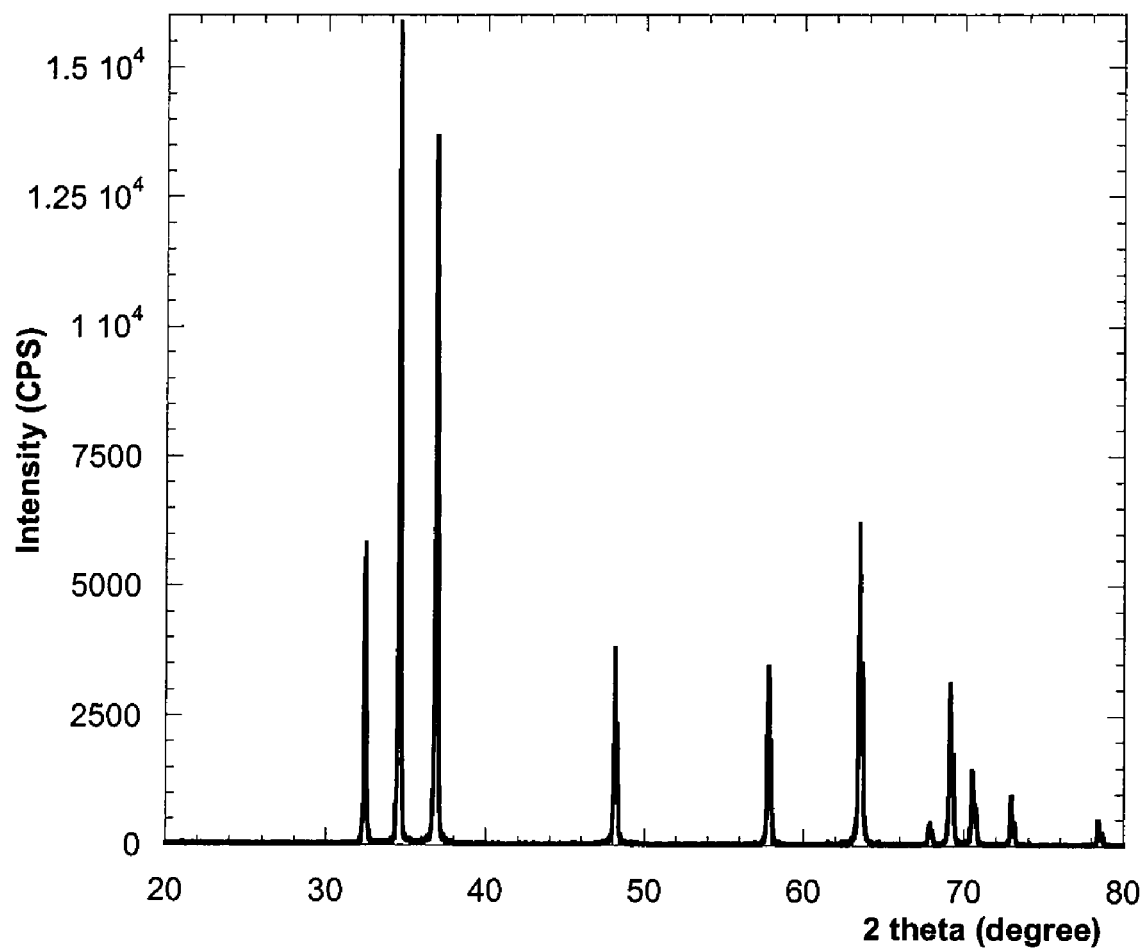
FIG. 9 illustrates the XRD pattern for GaN powder produced in a boron nitride crucible after removal of the bismuth wetting agent.

Results: Metal Ga was fully converted into GaN powder within 4 hours. The color of the powder produced was light gray. Twenty-five grams of metal gallium was fully converted into 30.735 g of GaN powder. The GaN powder was analyzed by XRD and GDMS; XRD analysis confirmed that the powder was composed of only GaN single phase. FIG. 9 illustrates the XRD plot for the GaN powder produced in BN boat after removal of the bismuth wetting agent by evaporation. GDMS indicated that the purity of the powder was greater than 99.91%. Table 2 illustrates a comparison of the GaN purity of Example 2 and Example 4, as analyzed by GDMS.

TABLE 2

A comparison of the GaN purity of Example 2 and Example 4, as analyzed by GDMS. (Analysis by Shiva Technologies, Inc.)

| Element | Example 2 Conc. [ppm wt] | Example 4 Conc. [ppm wt] | Element | Example 2 Conc. [ppm wt] | Example 4 Conc. [ppm wt] |
| --- | --- | --- | --- | --- | --- |
| Li | 0.02 | <0.01 | Pd | <0.5 | <0.5 |
| Be | <0.01 | <0.01 | Ag | <0.1 | <0.1 |
| B | 3.3 | 60 | Cd | <0.1 | <0.1 |
| C | ~50 | ~8 | In | Binder | Binder |
| N | Matrix | Matrix | Sn | <0.05 | <0.05 |
| O | ~650 | ~450 | Sb | <0.05 | <0.05 |
| F | <0.5 | <0.5 | Te | <0.05 | <0.05 |
| Na | 1.3 | 1.6 | I | <0.05 | <0.05 |
| Mg | 0.83 | <0.05 | Cs | <0.05 | <0.05 |
| Al | 210 | 0.16 | Ba | <0.05 | <0.05 |
| Si | 380 | 46 | La | <0.05 | <0.05 |
| P | 0.42 | <0.05 | Ce | <0.05 | <0.05 |
| S | 2.1 | 39 | Pr | <0.05 | <0.05 |
| Cl | 11 | 12 | Nd | <0.05 | <0.05 |
| K | 4.1 | <0.05 | Sm | <0.05 | <0.05 |
| Ca | 0.58 | 0.17 | Eu | <0.05 | <0.05 |
| Sc | <0.05 | <0.05 | Gd | <0.05 | <0.05 |
| Ti | 3.7 | 0.02 | Tb | <0.05 | <0.05 |
| V | <0.1 | <0.1 | Dy | <0.05 | <0.05 |
| Cr | 1.2 | 18 | Ho | <0.05 | <0.05 |
| Mn | 0.07 | 0.58 | Er | <0.05 | <0.05 |
| Fe | 8.3 | 2.8 | Tm | <0.05 | <0.05 |
| Co | <0.01 | <0.01 | Yb | <0.05 | <0.05 |
| Ni | 0.5 | 4.1 | Lu | <0.05 | <0.05 |
| Cu | 0.07 | 0.25 | Hf | <0.05 | <0.05 |
| Zn | 0.12 | 0.33 | Ta | <100 | <100 |
| Ga | Matrix | Matrix | W | <0.05 | <0.05 |
| Ge | <0.1 | <0.1 | Re | <0.05 | <0.05 |
| As | <0.1 | <0.1 | Os | <0.05 | <0.05 |
| Se | <0.1 | 0.22 | Ir | <0.05 | <0.05 |
| Br | <0.1 | <0.1 | Pt | <0.05 | <0.05 |
| Rb | <0.1 | <0.1 | Au | <0.1 | <0.1 |
| Sr | <0.05 | <0.05 | Hg | <0.1 | <0.1 |
| Y | <0.05 | <0.05 | Tl | <0.05 | <0.05 |
| Zr | 0.12 | <0.05 | Pb | <0.05 | <0.05 |
| Nb | <0.05 | <0.05 | Bi | 420 | 15 |
| Mo | <0.05 | <0.05 | Th | <0.01 | <0.01 |
| Ru | <0.1 | <0.1 | U | <0.01 | <0.01 |
| Rh | <0.05 | <0.05 | | | |

The GaN powder of Example 2 was synthesized in quartz vessel. The GaN powder of Example 4 was synthesized in the BN boat. As shown in Table 2, the Si and Al concentrations were dramatically reduced when a BN boat was used as a reaction vessel. The purity in of Example 4 is at least 99.91%.

The purity can be further improved by the use of SiC or TaC coated boats in place of quartz or BN reaction vessels.

Example 5

Gallium Nitride Doped with 0.5 mol % Erbium

In this example, Erbium was added to the reaction mixture to produce an Erbium-doped GaN powder. The method of Example 2 was used, except where noted below. The reactants were metal gallium (25 g), bismuth (0.757 g (1 mol %)), erbium (Er) (0.305 g (0.5 mol %)), and purified ammonia gas. The reaction temperature was 1000° C., the reaction time was 5 hours, and the $NH_3$ flow rate was 600 sccm. A quartz reaction vessel was used to contain initial reactants.

The Ga—Er—Bi alloy was prepared as follows. Er was formed into small particles in a glove box under an Ar atmosphere. The metal reactants (Ga, Er and Bi) were transferred into a small quartz tube and the tube was sealed to maintain an Ar atmosphere and the quartz tube and contents were placed in a furnace. The temperature was gradually increased to 350-400° C. as the furnace was purges with Ar gas. The quartz tube was agitated through vibration to facilitate mixing and alloy formation. The metals were heated for 1-2 hours to ensure a uniform and homogeneous alloy was formed in the quartz tube. The alloy was transferred a reaction vessel in a glove box and was sealed. Care is taken at all times to prevent exposure of the Er with nitrogen and oxygen gases.

Results: the Ga—Er—Bi alloy was fully converted into a GaN doped with Er powder within 5 hours. The color of the powder formed was light gray, and weighted 30.025 grams. XRD analysis was performed, confirming GaN formation.

Example 6

Gallium Nitride Doped with 0.25 mol % Erbium

The method of Example 5 was used, but the quantity of erbium was changed to 0.25 mol % (0.152 g). High conversion rates were observed, but some product adhered to the reaction boat, contributing to a less than 100% yield on the current reaction scale. XRD analysis was performed, confirming GaN formation. Appropriate peak shifting was observed in the XRD pattern, indicating inclusion of Er within the GaN matrix.

Example 7

Gallium Nitride Doped with 0.1 mol % Erbium

The method of Example 5 was used, but the quantity of erbium was changed to 0.1 mol % (0.061 g). High conversion rates were observed, but some product adhered to the reaction boat, contributing to a less than 100% yield on the current reaction scale. XRD analysis was performed, confirming GaN formation. Appropriate peak shifting was observed in the XRD pattern, indicating inclusion of Er within the GaN matrix.

Example 8

Green Light Emission from Erbium-doped GaN Powder

The direct observation of a strong green emission from erbium-doped GaN powder is reported in this Example. Gallium nitride was doped with erbium in situ during preparation of the erbium-doped GaN.

Methods and Materials:

The starting materials included 99.9999% pure gallium, 99.999% pure bismuth shot, 99.9% pure erbium ingots and 99.9999% pure ammonia gas. Purity of solid materials can be determined by GDMS (wt. % purity). An ammonia purifier was used to remove residual water vapor and oxygen from the ammonia gas.

Twenty-five grams of gallium was mixed with 1 mol % of erbium in a quartz tube. Bismuth (1 mol %) was added as a wetting agent. The quartz tube was then loaded into a vertical furnace. After purging the tube with argon (Ar) gas for one hour, the sample was heated under flowing Ar. When the melt temperature reached 1000° C., the gas source was switched from Ar to ammonia ($NH_3$). The furnace was maintained at a constant temperature for 3-5 hours. The sample was then cooled to room temperature under flowing $NH_3$. No residual metal Ga or Er was observed by ocular inspection. No further etching was necessary to remove unreacted metals. The material was crushed and slightly ground with a mortar and pestle.

Removal of the bismuth wetting agent from the GaN:Er powder was achieved by heating the powder to 1030° C. under flowing $NH_3$ gas for three hours. At this temperature, the bismuth equilibrium vapor pressure is about 1200 Pa, more than 1000 times greater than that of Ga or Er. Bismuth was easily removed by evaporation while the $NH_3$ prevented GaN decomposition.

Figure 10:
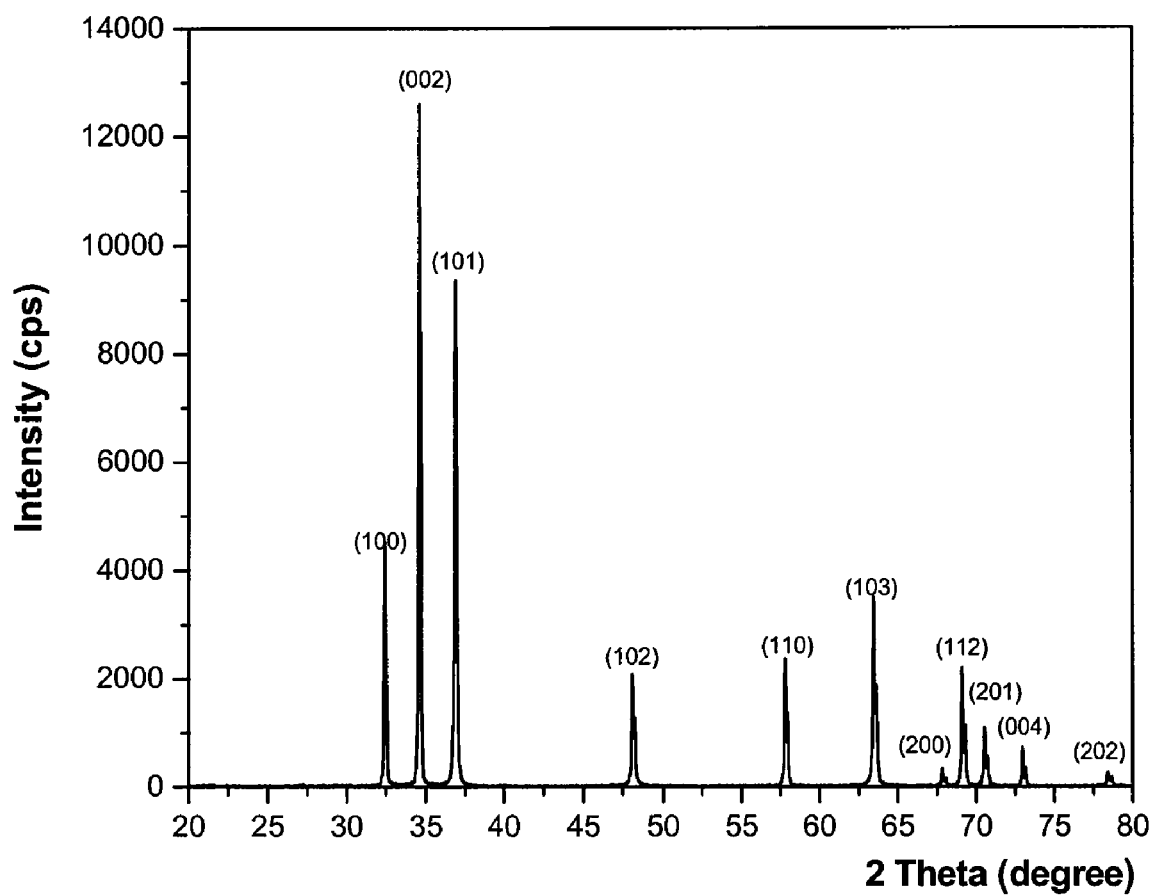
FIG. 10. illustrates a representative X-ray diffraction pattern of the erbium-doped GaN powder after the removal of bismuth.

Results and Analysis:

Erbium-doped GaN (GaN:Er) powder was examined by x-ray diffraction (XRD) using Cu $K_\alpha$ radiation. FIG. 10 shows the XRD pattern of GaN:Er powder after bismuth removal. The XRD pattern of the GaN:Er powder indicates a wurtzite structure. The peaks of this XRD pattern correspond well with those of a hexagonal GaN reported in the ASTM X-ray powder data file (PDF card 50-0792). No free gallium, erbium, or other phases were detected.

Figure 11:
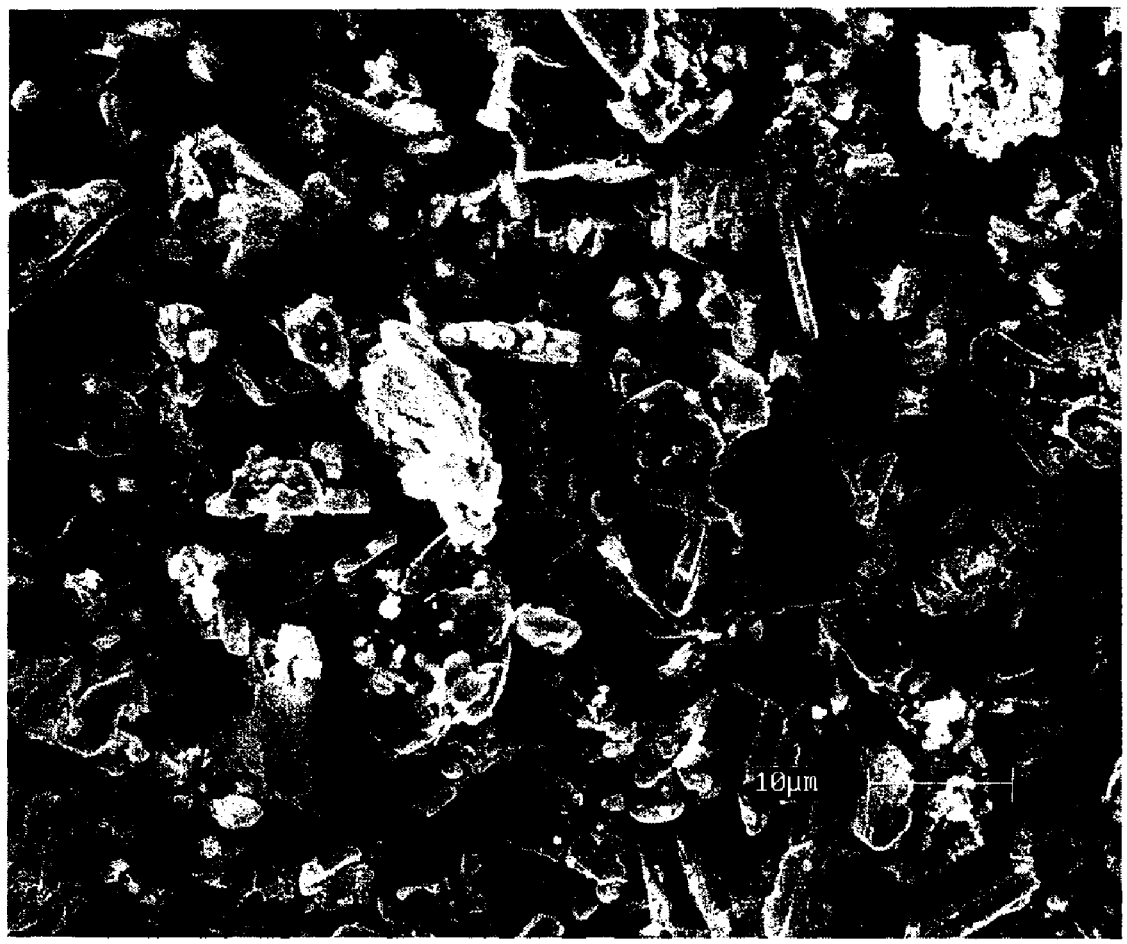
FIG. 11. illustrates an SEM image of the morphology of synthesized GaN:Er powder.

The (0002) peak of FIG. 10 is stronger than the (10$\bar{1}$1) peak. FIG. 11 illustrates a scanning electron micrograph (SEM) picture of the GaN:Er powder. The SEM picture of the powder particle surface morphology provides an explanation for the stronger (0002) peak. The SEM image shows the particle size distributed from 1 μm to 10 μm, with a majority at around 5 μm. While several particle morphologies can be observed (plates, polyhedra and needles), the predominant morphology is plate. The aspect ratios of the plates range from 10 to 50. The strong (0002) orientation indicated in XRD is likely caused by the alignment of the plates during the XRD sample preparation.

Considering that the ionic radius of $Er^{3+}$ is 1.75 Å compared to 1.30 Å for $Ga^{3+}$, the erbium concentration in GaN cannot be high under equilibrium conditions. However, erbium has very high solid solubility in Ga at high temperature. Shkol'nikova noted that the erbium solubility in gallium increased from 0.5% to 2.13% (mass fraction) with a temperature increase of 450° C. to 650° C. (T. M. Shkol'nikova, et al. *Zhurnal Fizicheskoi Khimii* 1972, 46(3), 804). Erbium solubility in Ga can reach 8% at 800° C. In the GaN:Er powder synthesis process, erbium can fully dissolve into the gallium melt at high temperature under argon before flowing $NH_3$ is applied. The $NH_3$ reacts with molten gallium immediately when the gas is switched to $NH_3$. The yield of the powder synthesis was greater than 99% within one hour. It is believed that the lateral growth rate of GaN in this process is very high. Under this high growth rate, erbium can easily be incorporated into the GaN structure instead of forming precipitates or microparticles. The bismuth wetting agent prevents GaN crust formation during the process.

Figure 12:
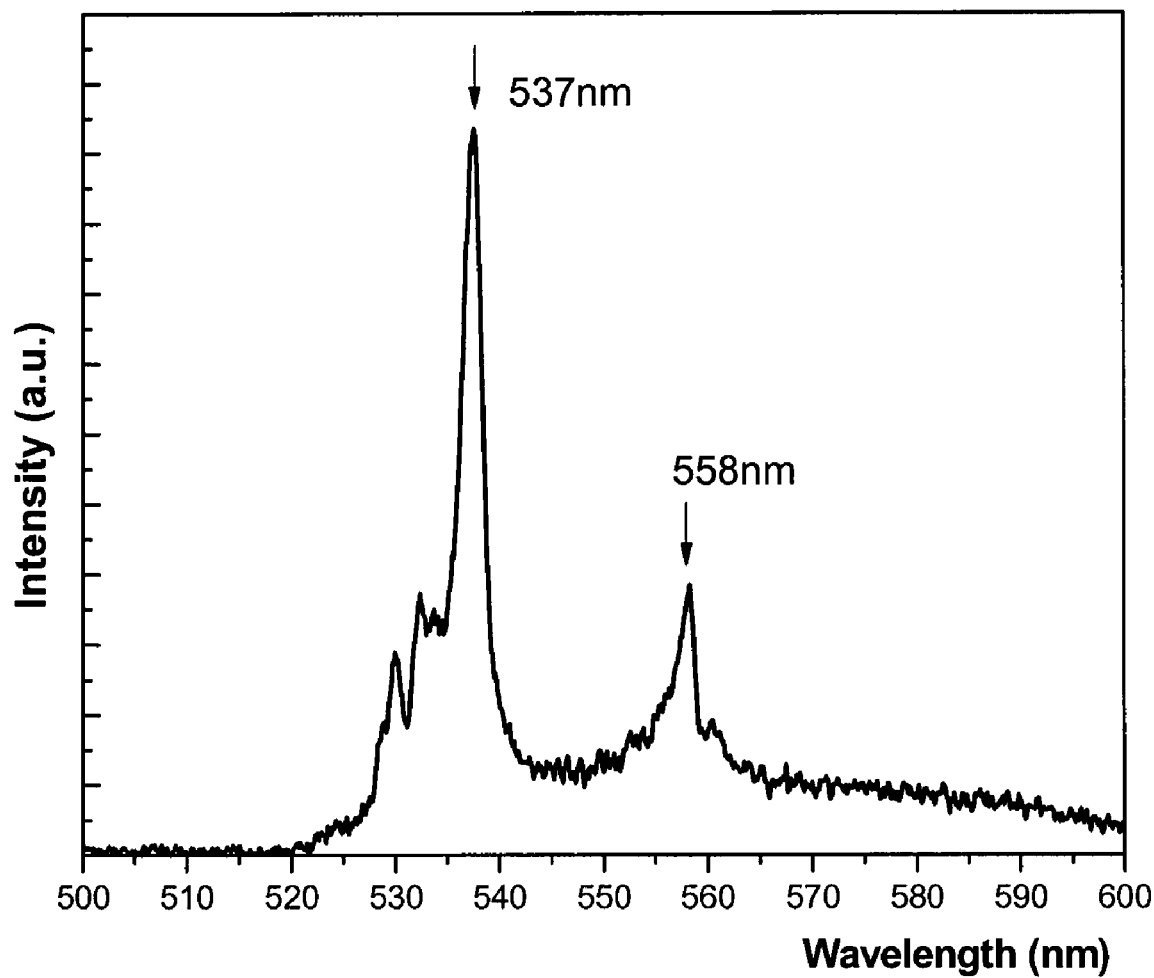
FIG. 12. illustrates a PL spectra of erbium-doped GaN powder. The PL is performed at room temperature with an argon laser line at 496.5 nm.

Photoluminescence (PL) characterization was performed by exciting a sample of GaN:Er with an argon laser at a wavelength of 496.5 nm (2.5 eV), corresponding to energy smaller than the GaN band gap (3.4 eV). PL excitation resulted in green emission from the Er:GaN powder. Room temperature PL at visible wavelengths is shown in FIG. 12. Two major emissions were observed in the green region, with the strongest lines at 537.5 nm and 557.8 nm. Green emission at 537 nm is one of the characteristic emissions due to a 4f-4f inner shell transition of $Er^{3+}$ ions and is attributed to a transition from $^2H_{11/2}$ to the ground state $^4I_{15/2}$. The 558 nm emission corresponds to the transition from $^4S_{3/2}$ to $^4I_{15/2}$. The full width at half maximum (FWHM) of the main component of these transitions is close to 3 nm, which corresponds to an energy width of ~13 meV.

Figure 13:
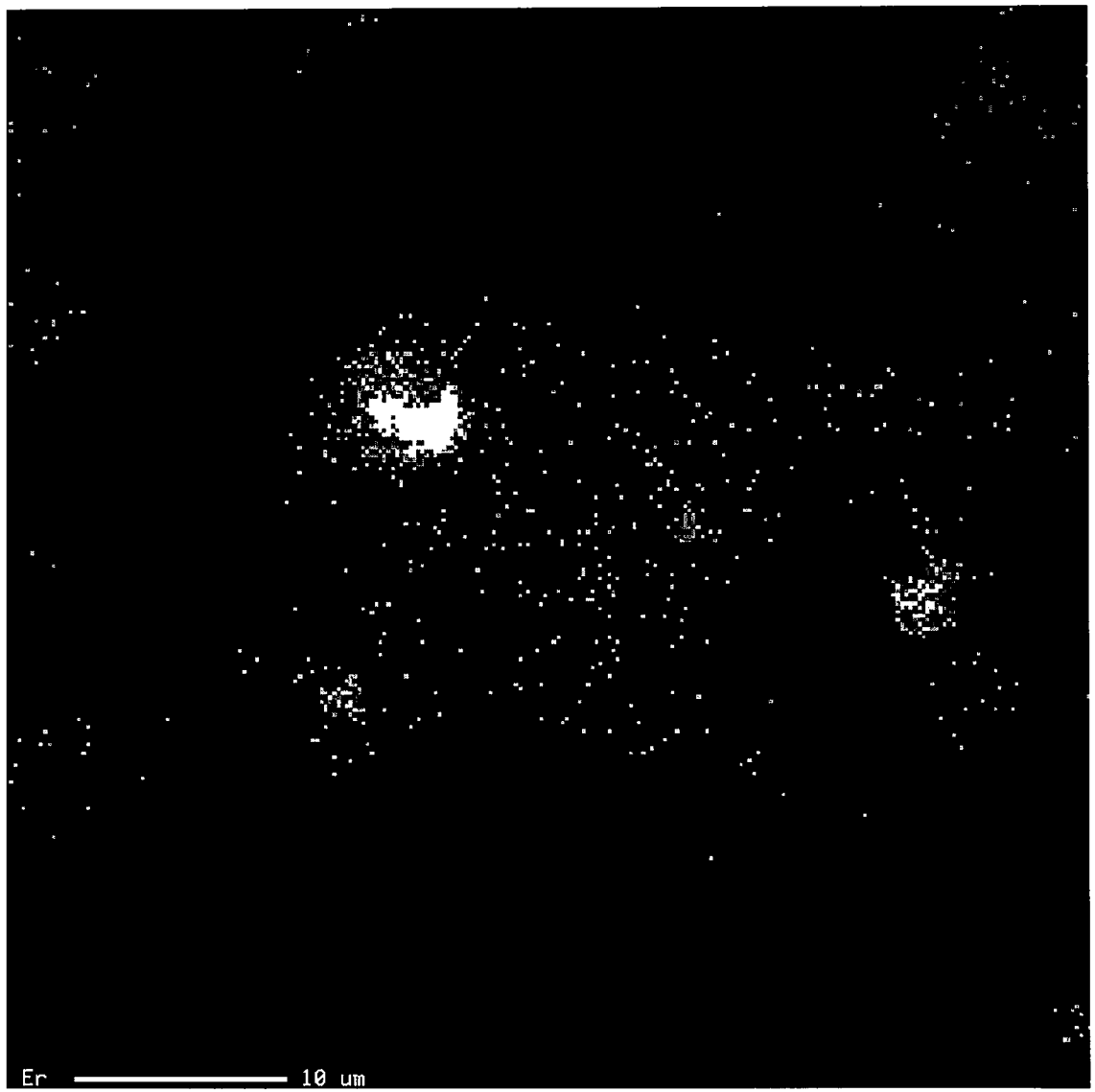
FIG. 13. illustrates a microprobe mapping analysis of a ~20 μm diameter erbium-doped GaN particle.

Electron probe microanalysis (microprobe) was used to analyze the erbium element distribution in the GaN particles. A GaN particle around 20 µm in width was selected for analysis. FIG. 13 shows the microprobe mapping measurement results. Erbium is distributed across the entire GaN particle, and the erbium concentration is fairly constant. The two areas of higher erbium concentrations are believed to result from erbium precipitates.

Discussion:

Green light emission has been directly obtained from erbium-doped GaN powder. Erbium was successfully incorporated into a GaN powder through the reaction of molten gallium and erbium with ammonia gas at 1000° C., using bismuth as a wetting agent. Photoexcitation with an argon laser resulted in strong green emissions from two narrow lines at 537 and 558 nm, identified as erbium transitions from the $^2H_{11/2}$ and $^4S_{3/2}$ levels to the $^4I_{15/2}$ ground state. X-ray diffraction indicated that the erbium-doped GaN powder has a wurtzite structure. Microprobe analysis revealed that erbium is distributed evenly in the powder particles.

This Example illustrates a process for doping Group III nitride powders with rare earth metals. The 4f luminescence of rare earth elements can be excited via minority-carrier injection in a 4f-doped pn junction or Schottky diode. Rare earth metal-doped Group III nitride powder can be dispersed into polymers and spin-coated on different substrates. Accordingly, materials are thus provided for the development of full color optical displays in a cost-efficient manner.

Example 9

Red Light Emission from Europium-doped GaN Powder

This Example describes a high yield process to produce gallium nitride (GaN) powder doped with europium. Europium (Eu) was incorporated in situ into GaN powder through the reaction between a molten alloy of Ga and Eu along with $NH_3$ at 1000° C. using Bi as a wetting agent. This procedure provides a method to produce a GaN:Eu phosphor with high yield and low cost. Strong red light emission was observed from this powder when it was optically excited either above- or below the GaN bandgap, or by an electron beam.

Room temperature photoluminescence (PL) measurements were conducted on GaN:Eu powders with different Eu concentrations. The maximum PL intensity was obtained at a Eu concentration of 1.25 mol %. Cathodoluminescence (CL) spectra at room temperature exhibited several detailed transitions in the 530-630 nm range.

Materials and Methods:

The starting materials used for making the GaN:Eu powder included 99.9999% pure gallium, 99.999% pure bismuth shot, 99.9% pure europium ingot, and 99.9999% pure ammonia. As a note of caution, $Eu_2O_3$ can be formed if Eu is exposed to air because Eu can react with oxygen at room temperature.

Twenty-five grams of Ga were mixed with 0.5-3 mol % of Eu and 3 mol % Bi in a glove box. The mixture was sealed into a quartz tube under vacuum, then heated to 830° C. for several hours to form an alloy. As the temperature is reduced, it is expect that Eu and Ga form the intermetallic compound $EuGa_4$, while Bi reacts with Eu to form either EuBi or a GaBi alloy according to the published phase diagrams (*Desk handbook: Phase Diagram for Binary Alloys*, H. Okamoto, ed. (ASM International, 2000)). After the tube cooled to room temperature, the product was transferred to the quartz tube reaction vessel. The quartz reaction tube was then loaded into a vertical furnace, evacuated and back filled with pure Ar gas, then heated under flowing Ar. When the melt temperature reached the appropriate reaction temperature of 1000° C., the gas was switched from Ar to $NH_3$. At this temperature the entire charge was molten, in accordance with the published phase diagrams. At about five hours the alloy had completely converted into powder.

After the reaction was complete, the tube was allowed to cool to room temperature under flowing $NH_3$. The final product obtained from this process was a mass of powder without any visible metal remaining. No further etching steps are needed to remove unreacted metals. The powder mass can be removed easily from the quartz tube and ground into a finer powder. To remove the Bi, the powder was annealed at 1030° C. for one to four hours to evaporate the Bi under flowing $NH_3$, which prevents the powder from decomposing. At this temperature, the Bi equilibrium vapor pressure is about $10^3$ and $10^6$ times higher than that of pure Ga and Eu respectively, and much higher than the metal vapor pressures of their nitrides. Bi serves as a crucial wetting agent to help the conversion from Ga into GaN and to prevent the crust formation which is typically observed in GaN powder synthesis processes. The detailed synthetic procedures and mechanism has been discussed in other papers. For example, a high yield synthetic procedure to prepare high purity GaN powder using Bi as a wetting agent was recently developed (H. Wu, J. Hunting, K. Uheda, L. Lepak, P. Konkapaka, F. J. DiSalvo, and M. G. Spencer, *J. Crystal Growth* 2005, 279, 303, incorporated by reference in its entirety). In addition, erbium has been incorporated into GaN powder (H. Wu, C. B. Poitras, M. Lipson, M. G. Spencer, J. Hunting, and F. J. DiSalvo, *Appl. Phys. Lett.* 2005, 86, 191918, incorporated by reference in its entirety), and the emission of green light was reported when the powder was optically excited below the GaN bandgap.

Results and Analysis:

X-ray diffraction (XRD) analysis was performed on the GaN:Eu powder. No elemental Eu, Ga, Bi or EuN were detected in any of the samples with the various Eu concentrations. The peaks in the measured XRD pattern matched the respective GaN peaks reported in the ASTM X-ray powder data file. A scanning electron microscopy (SEM) image exhibited particle sizes distributed from 1 µm to 5 µm, with a majority around 3 µm. Several particle morphologies were observed, including flakes, polyhedra and needles. The particles were highly faceted and hexagonal structure was clearly observed. Many layers in the particle could be observed indicating that the particles were grown layer by layer. The lateral growth rate was much higher than the c-direction growth rate. It was apparent that the GaN:Eu powder synthesized had very high crystalline quality.

Photoluminescence (PL) characterizations were performed with a HeCd laser (325 nm) and Ar laser (457.9 nm), which provide above and below bandgap excitations respectively. All PL measurements were performed at room temperature. Strong red light emitted from the powder when it was pumped with either the above- or below bandgap laser. The red color was mainly due to the 621 nm peak which was the strongest of the Eu emissions.

A series of PL spectra were conducted under HeCd laser excitation from GaN powders with different Eu concentration including a pure GaN powder sample without any Eu. The energy transfer from GaN host material to the $Eu^{3+}$ ions was evident. The 366 nm peak corresponding to the GaN band edge emission decreased dramatically when Eu was introduced into the powder. The emission peaks of the $Eu^{3+}$ ions intensified with increasing Eu concentration up to 1.25%, and weakened for higher doping concentrations. The decrease of the GaN band edge peak emission indicateed increased energy transfer from the GaN to the $Eu^{3+}$ ions. For the Eu emission, the decrease in emission for doping concentrations higher than 1.25% was potentially due to cross-relaxation between $Eu^{3+}$-$Eu^{3+}$ ions. In these experiments, 1.25 mol % of Eu provided the greatest intensity with regard to red light emission. The FWHM for 621 nm peaks was about 2.2 nm and showed relative constancy for various Eu concentrations.

Figure 14:
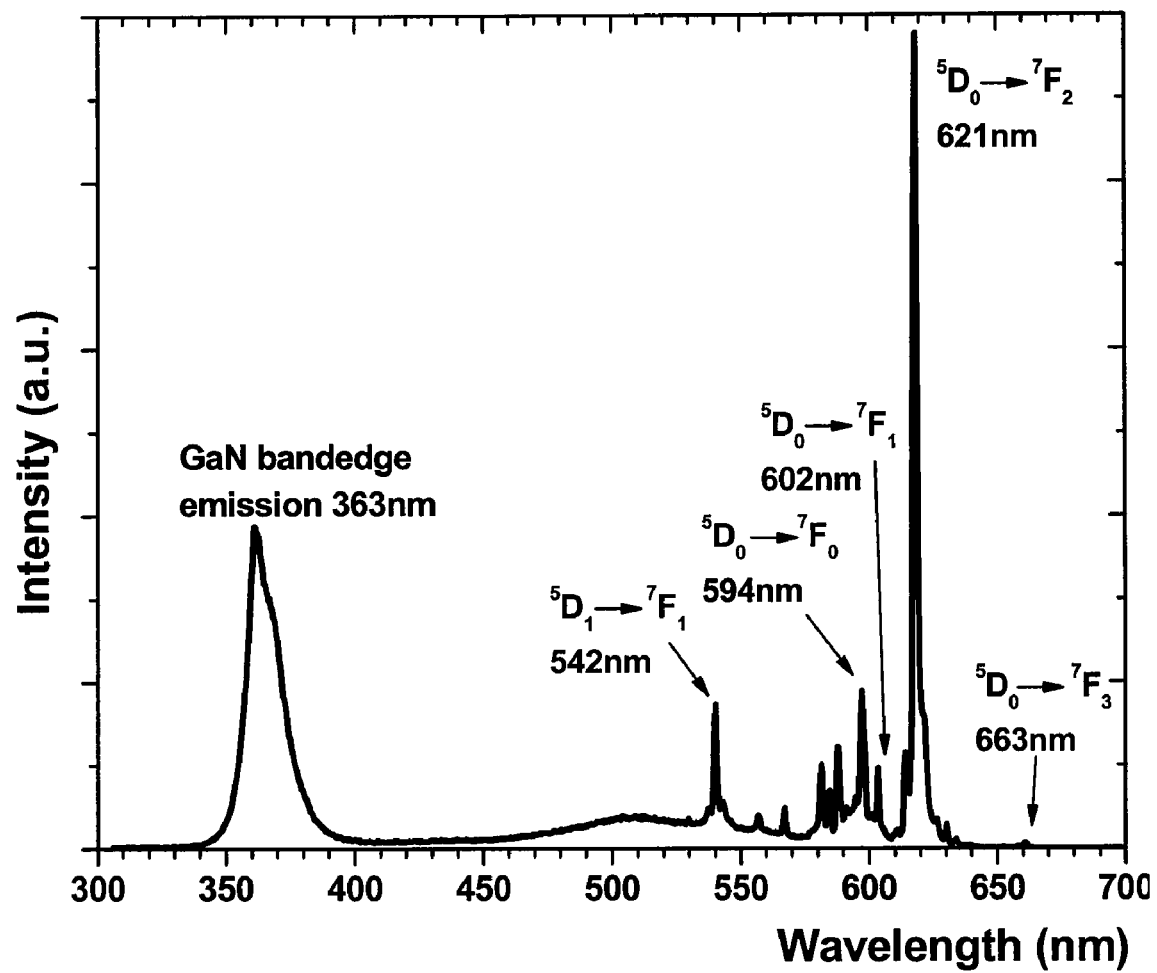
FIG. 14. illustrates the CL of GaN powder doped with 1% Eu at room temperature. Many detailed transitions can be observed in the 530-630 nm range.

Cathodoluminescence (CL) was measured at room temperature. The excitation source was a 3 KeV electron beam focused on a 5 mm diameter spot. FIG. 14 is a CL spectrum for GaN powder with 1% Eu. Both GaN band edge emission and $Eu^{3+}$ ions emission at 621 nm were detected. The Eu ions emission at 621 nm, however, was much stronger and sharper compared to the GaN bandedge emission at 362 nm. The FWHMs were 1.6 and 14.2 nm for the 621 and 362 nm peaks, respectively. It was noted that there were several sharp peaks from 530 to 620 nm in the spectrum. Each of these peaks were reproduced in samples with different Eu concentrations. This indicates the high crystalline quality of the host particles. Some of these peaks can be attributed to the transitions reported in the literature and which have been marked in the FIG. 14. Other peaks in the spectrum are believed to be transitions from other $^5D_j$ to the $^7F_j$ levels. These peaks in the CL spectrum can provide much information for understanding the energy transfer processes between the $Eu^{3+}$ ions and the GaN host.

Discussion:

The synthesis of, and the structural and optical emission characteristics of, Eu-doped GaN powder have been described. Europium was doped in situ into the GaN powder during the synthetic process. Strong red emission was observed from the powder when it was optically excited by both below- and above the bandgap of the host material, and by electron beam, at room temperature. Opportunities for low cost electroluminescent devices or hybrid structures are possible due to the powder form of this material.

Example 10

Gallium Nitride Doped with 1 mol % Cerium

In this example, Cerium was added to the reaction mixture to produce a Cerium-doped GaN powder. The method of Example 2 was used, except where noted below. The reactants were metal gallium (25 g), bismuth (2.271 g (3 mol %)), cerium (Ce) (1.507 g (1 mol %)), and purified ammonia gas. The reaction temperature was 1000° C., the reaction time was 5 hours, and the $NH_3$ flow rate was 500 sccm. A quartz reaction vessel was used to contain initial reactants.

The Ga—Ce—Bi alloy was prepared as follows. Cerium was formed into small particles in a glove box under an Ar atmosphere. The metal reactants (Ga, Ce and Bi) were transferred into a small quartz tube and the tube was sealed to maintain an Ar atmosphere. The quartz tube and contents were placed in a furnace. The temperature was gradually increased to 780-830° C. as the furnace was purged with Ar gas. The quartz tube was agitated through vibration to facilitate mixing and alloy formation. The metals were heated for 1-2 hours to ensure a uniform and homogeneous alloy was formed in the quartz tube. The alloy was transferred a reaction vessel in a glove box and was sealed. Care was taken at all times to prevent exposure of the Ce with nitrogen and oxygen gases.

Results: the Ga—Ce—Bi alloy was fully converted into a GaN powder doped with Ce within 5 hours. The color of the powder formed was light gray, and weighted 32.725 grams. XRD analysis was performed, confirming GaN formation.

Example 11

Gallium Nitride Doped with 1.5 mol % Cerium

The method of Example 9 was used, except that the quantity of cerium was changed to 1.5 mol % (2.261 g). High conversion rates were observed, but some product adhered to the reaction boat, contributing to a less than 100% yield for this reaction scale. XRD analysis was performed, confirming GaN formation. Appropriate peak shifting was observed in the XRD pattern, indicating inclusion of Ce within the GaN matrix.

Example 12

Gallium Nitride Doped with 0.5 mol % Cerium

The method of Example 9 was used, except that the quantity of cerium was changed to 0.5 mol % (0.754 g). High conversion rates were observed, but some product adhered to the reaction boat, contributing to a less than 100% yield on the current reaction scale. XRD analysis was performed, confirming GaN formation. Appropriate peak shifting was observed in the XRD pattern, indicating inclusion of Ce within the GaN matrix.

Example 13

Gallium Nitride Doped with 1 mol % Cerium

In this example, Cerium was added to the reaction mixture to produce a Cerium-doped GaN powder. The method of Example 2 was used, except where noted below. The reactants were metal gallium (25 g), bismuth (2.271 g (3 mol %)), cerium (Ce) (1.507 g (1 mol %)), and purified ammonia gas. The reaction temperature was 1000° C., the reaction time was 5 hours, and the $NH_3$ flow rate was 500 sccm. Metal Ga ingot, Ce powder and Bi shots were added into the reaction tube. A quartz reaction vessel was used to contain initial reactants.

Results: the Ga—Ce—Bi alloy was fully converted into a GaN powder doped with Ce within 5 hours. The color of the powder formed was light gray, and weighted 32.725 grams. XRD analysis was performed, confirming GaN formation.

Example 14

Gallium Nitride Doped with 1 mol % Cerium in a Boron Nitride Tube

In this example, Cerium was added to the reaction mixture to produce a Cerium-doped GaN powder. The method of Example 2 was used, except where noted below. The reactants were metal gallium (25 g), bismuth (2.271 g (3 mol %)), cerium (Ce) (1.507 g (1 mol %)), and purified ammonia gas. The reaction temperature was 1000° C., the reaction time was 5 hours, and the $NH_3$ flow rate was 500 sccm. Metal Ga ingot, Ce powder and Bi shots were added into the reaction tube. A boron nitride (BN) reaction vessel was used to contain initial reactants.

Results: the Ga—Ce—Bi alloy was fully converted into a GaN powder doped with Ce within 5 hours. The color of the powder formed was light gray, and weighted 32.725 grams. XRD analysis was performed, confirming GaN formation.

All publications, patents, and patent documents herein are incorporated by reference, as though individually incorporated by reference. The invention has been described with reference to various specific and preferred embodiments and techniques. However, it should be understood that many variations and modifications may be made while remaining within the spirit and scope of the invention.

What is claimed is:

1. A composition consisting essentially of crystalline gallium nitride (GaN) and about 0.1 mol % to about 3 mol % of a dopant;
    wherein the dopant is beryllium, magnesium, manganese, molybdenum, silicon, zinc, cerium, samarium, dysprosium, erbium, europium, promethium, thulium, ytterbium, yttrium, or a combination thereof, and the dopant is located within the crystalline matrix of the gallium nitride; and
    the concentration of oxygen atoms in the composition is about 650 parts per million wt. % or less and the concentration of carbon atoms in the composition is about 50 parts per million wt. % or less.

2. The composition of claim 1 wherein the gallium nitride composition is a powder.

3. The composition of claim 2 wherein the gallium nitride powder composition comprises single crystals.

4. The composition of claim 3 wherein the gallium nitride powder composition comprises crystalline plates of about 0.1 µm to about 50 µm in diameter.

5. The composition of claim 1 wherein the composition is substantially free of elemental deposits of the dopant outside the gallium nitride crystalline matrix.

6. The composition of claim 1 wherein the dopant is erbium.

7. The composition of claim 6 wherein the erbium is present in about 0.1 mol % to about 1 mol %.

8. The composition of claim 6 wherein the composition emits green light when subjected to photoexcitation.

9. The composition of claim 1 wherein the dopant is europium.

10. The composition of claim 9 wherein the europium is present in about 0.5 mol % to about 3 mol %.

11. The composition of claim 9 wherein the composition emits red light when subjected to photoexcitation.

12. The composition of claim 1 wherein the dopant is cerium.

13. The composition of claim 12 wherein the cerium is present in about 0.5 mol % to about 1.5 mol %.

14. A composition consisting essentially of crystalline gallium nitride (GaN) and about 0.1 mol % to about 3 mol % of a dopant;
    wherein the dopant is erbium or europium, and the dopant is located within the crystalline matrix of the gallium nitride;
    the concentration of oxygen atoms in the composition is about 450 parts per million wt. % or less, the concentration of carbon atoms in the composition is about 8 parts per million wt. % or less; and
    the composition emits green light when subjected to photoexcitation when the dopant is erbium, and the composition emits red light when subjected to photoexcitation when the dopant is europium.

15. A method for making gallium nitride (GaN), the method comprising:
    contacting a mixture comprising gallium metal and one or more wetting agents, wherein the wetting agent is bismuth, germanium, tin, lead, antimony, tellurium, polonium, or a combination thereof, and optionally one or more dopants;
    wherein the gallium metal and the one or more wetting agents are present in a molar ratio of about 20:1 to about 500:1;
    with ammonia gas to form a gallium nitride composition, wherein the contacting of the mixture and the ammonia gas is carried out while the mixture is heated to about 262° C. to about 1500° C. and the mixture is contacted with the ammonia gas by contacting the ammonia gas to the surface of the mixture, to the interior of the mixture, or both;
    forming the gallium nitride composition into a powder; and
    removing at least a portion of the wetting agent from the gallium nitride powder composition.

16. The method claim 15 wherein the powder comprises crystalline gallium nitride particles and the particles include hexagonal polycrystalline GaN particles, cubic polycrystalline GaN particles, or a combination thereof.

17. The method claim 15 wherein the one or more dopants comprise beryllium, magnesium, manganese, molybdenum, silicon, zinc, cerium, samarium, dysprosium, erbium, europium, promethium, thulium, ytterbium, yttrium, boron, aluminum, indium, a compound of boron, a compound of aluminum, or a compound of indium, or a combination thereof.

18. The method of claim 15 wherein the gallium nitride composition does not comprise a dopant and the gallium nitride composition emits yellow light when subjected to photoexcitation.

19. The method of claim 15 wherein the dopant is erbium and the gallium nitride composition emits green light when subjected to photoexcitation.

20. The method of claim 15 wherein the dopant is europium and the gallium nitride composition emits red light when subjected to photoexcitation.

* * * * *